(12) United States Patent
Maeda et al.

(10) Patent No.: US 12,366,812 B2
(45) Date of Patent: Jul. 22, 2025

(54) DETECTION APPARATUS, DETECTION METHOD, EXPOSURE APPARATUS AND ARTICLE MANUFACTURING METHOD

(71) Applicant: CANON KABUSHIKI KAISHA, Tokyo (JP)

(72) Inventors: Hironori Maeda, Saitama (JP); Ryo Takai, Tochigi (JP); Masakatsu Yanagisawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 272 days.

(21) Appl. No.: 18/154,163

(22) Filed: Jan. 13, 2023

(65) Prior Publication Data

US 2023/0229095 A1    Jul. 20, 2023

(30) Foreign Application Priority Data

Jan. 18, 2022  (JP) .................................. 2022-005821

(51) Int. Cl.
*G03F 9/00* (2006.01)
*G03F 7/20* (2006.01)

(52) U.S. Cl.
CPC .............. *G03F 9/7088* (2013.01); *G03F 7/20* (2013.01); *G03F 9/7092* (2013.01)

(58) Field of Classification Search
CPC ........ G03F 7/20; G03F 9/7084; G03F 9/7088; G03F 9/7092; G01B 11/002
See application file for complete search history.

(56) References Cited

U.S. PATENT DOCUMENTS 5,532,822 A * 7/1996 Shinozaki ........... G03F 7/70716
                                                                      356/399
11,079,692 B2   8/2021 Yamaguchi

FOREIGN PATENT DOCUMENTS

| CN | 110657743 A | 1/2020 | |
| JP | 2021009230 A | 1/2021 | |
| KR | 1020210003045 A | 1/2021 | |
| WO | WO-2020001557 A1 * | 1/2020 | ........... G01B 11/002 |

* cited by examiner

*Primary Examiner* — Peter B Kim
(74) *Attorney, Agent, or Firm* — ROSSI, KIMMS & McDOWELL LLP

(57) ABSTRACT

A detection apparatus including a plurality of detection systems arranged spaced apart from each other so as to detect, of a plurality of marks provided on an object held by a stage, marks different from each other, and a processing unit configured to perform a first process of obtaining a first detection value by detecting the plurality of marks by one or more detection systems in a first state in which the stage is arranged at a first rotation angle, and a second process of obtaining a second detection value by detecting the plurality of marks by two or more detection systems in a second state in which the stage is arranged at a second rotation angle, and obtain a difference between the first detection value and the second detection value for each of the plurality of marks.

12 Claims, 20 Drawing Sheets

DETECTION APPARATUS, DETECTION METHOD, EXPOSURE APPARATUS AND ARTICLE MANUFACTURING METHOD

BACKGROUND OF THE INVENTION

Field of the Invention

The present invention relates to a detection apparatus, a detection method, an exposure apparatus and an article manufacturing method.

Description of the Related Art

In recent years, there is demand for an exposure apparatus used for the manufacture of a semiconductor device or the like to increase overlay accuracy between an original and a substrate along with further miniaturization. Since the overlay accuracy corresponding to about ⅕ of the resolution is usually required, improvement of the overlay accuracy becomes more and more important as the miniaturization of a semiconductor device advances.

In order to improve the overlay accuracy, for example, there is a method of increasing the number of marks (alignment marks) on the substrate detected by a position detection system. However, this method increases the time (detection time) required to detect the marks, resulting in a degradation in throughput of the apparatus. In order to achieve both increasing the number of marks to be detected and decreasing the detection time, there has been proposed a technique of detecting a plurality of marks on a substrate using a plurality of position detection systems. In order to implement highly accurate mark detection using the plurality of position detection systems, it is necessary to reduce the adjustment error of each position detection system. Japanese Patent Laid-Open No. 2021-9230 proposes a method of calculating the offset of each position detection system using a mark serving as a reference (reference mark).

However, even if the offset of each of the plurality of position detection systems is obtained with respect to the reference mark, the rotation amount of a stage with respect to each position detection system changes depending on the placement error of the substrate with respect to the stage. Due to the influence of this, the accuracy of mark detection may be degraded. This is due to an error caused by the difference between the stage posture upon detecting the marks on the substrate by one position detection system (monocular) and the stage posture upon detecting the marks on the substrate by a plurality of position detection systems (binocular). Further, even if the same binocular is used, the rotation amount of the stage changes depending on the placement error of the substrate with respect to the stage, and this leads to a degradation in mark detection accuracy.

SUMMARY OF THE INVENTION

The present invention provides a technique advantageous in achieving an improvement in overlay accuracy and high throughput using a plurality of detection systems that detect marks different from each other.

According to one aspect of the present invention, there is provided a detection apparatus for detecting a plurality of marks provided on an object, including a stage configured to be rotatable while holding the object, a plurality of detection systems arranged spaced apart from each other so as to detect, of the plurality of marks provided on the object held by the stage, marks different from each other, and a processing unit configured to perform a first process of obtaining a first detection value by detecting the plurality of marks by one or more detection systems of the plurality of detection systems in a first state in which the stage is arranged at a first rotation angle, and a second process of obtaining a second detection value by detecting the plurality of marks by two or more detection systems of the plurality of detection systems in a second state in which the stage is arranged at a second rotation angle different from the first rotation angle, and obtain a difference between the first detection value and the second detection value for each of the plurality of marks.

Further aspects of the present invention will become apparent from the following description of exemplary embodiments with reference to the attached drawings.

DESCRIPTION OF THE EMBODIMENTS

Figure 1:
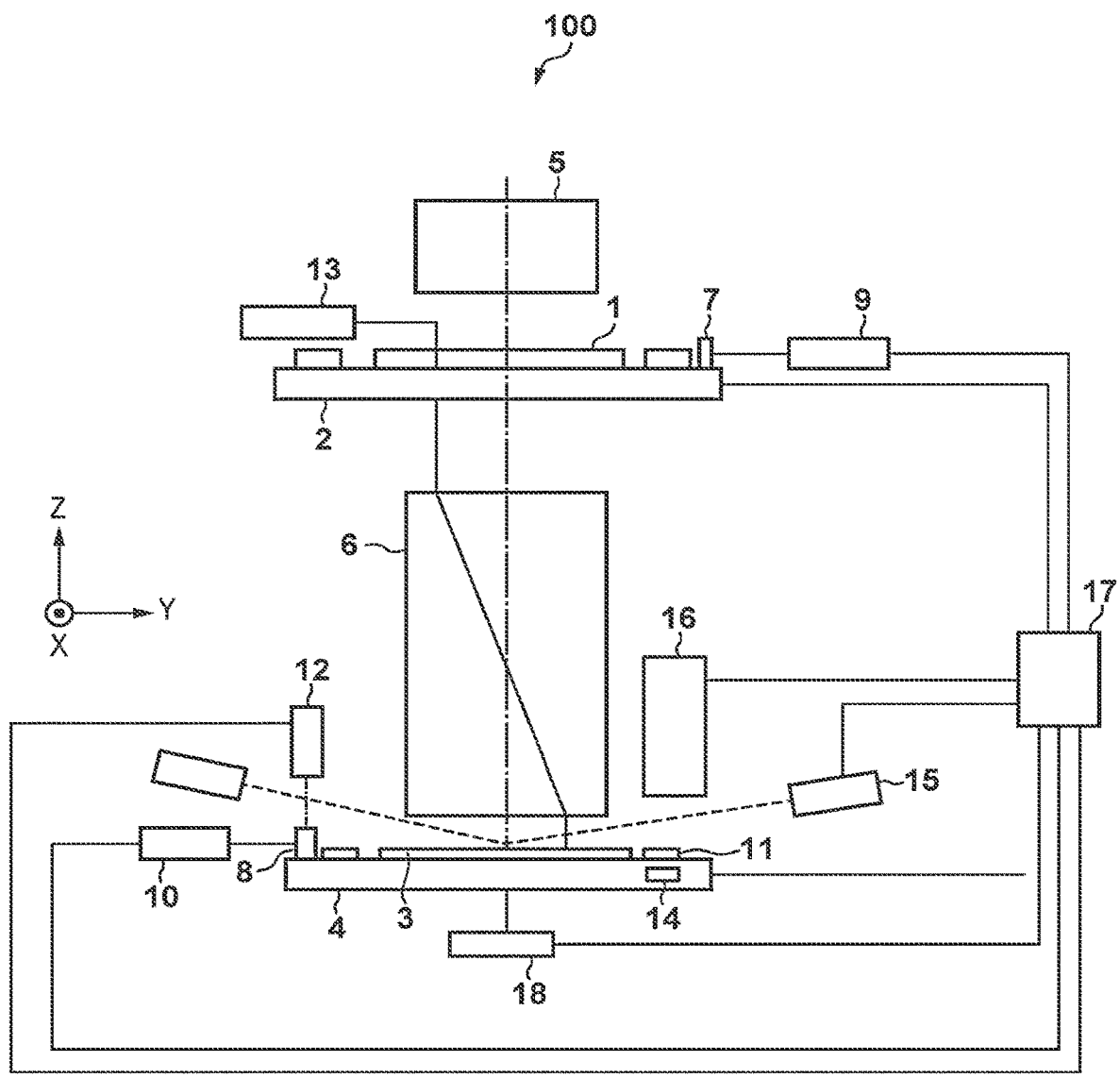
FIG. 1 is a schematic view illustrating configurations of an exposure apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view illustrating configurations of an exposure apparatus 100 according to an aspect of the present invention. The exposure apparatus 100 is a lithography apparatus that exposes a substrate via an original to form a pattern on the substrate. The exposure apparatus 100 includes an original stage 2 that holds an original 1 (reticle or mask), a substrate stage 4 that holds a substrate 3, and an illumination optical system 5 that illuminates the original 1 held by the original stage 2. The exposure apparatus 100 also includes a projection optical system 6 that projects (the image of) the pattern of the original 1 to the substrate 3 held by the substrate stage 4, and a control unit 17 that comprehensively controls the overall operation of the exposure apparatus 100.

In this embodiment, the exposure apparatus 100 is a scanning exposure apparatus (scanner) that transfers the pattern of the original 1 to the substrate 3 while synchronously scanning the original 1 and the substrate 3 in the scanning direction (that is, by a step & scan method). However, the exposure apparatus 100 may be an exposure apparatus (stepper) that transfers the pattern of the original 1 to the substrate 3 while fixing the original 1 (that is, by a step & repeat method).

In the following description, as illustrated in FIG. 1, a direction (optical axis direction) coincident with the optical axis of the projection optical system 6 will be defined as the Z direction. The scanning direction of the original 1 and the substrate 3 in a plane perpendicular to the Z direction will be defined as the Y direction. A direction (non-scanning direction) perpendicular to the Z and Y directions will be defined as the X direction. Directions around the X-, Y-, and Z-axes will be defined as $\theta X$, $\theta Y$, and $\theta Z$ directions, respectively.

The illumination optical system 5 illuminates the original 1, more specifically, a predetermined illumination region on the original with light (exposure light) of a uniform illuminance distribution. Examples of the exposure light are the g-ray and i-ray of ultra-high pressure mercury lamps, a KrF excimer laser, an ArF excimer laser, and an $F_2$ laser. To manufacture a smaller semiconductor element, extreme ultraviolet light (EUV light) of several nm to several hundred nm may be used as the exposure light.

The original stage 2 is configured to be two-dimensionally movable in a plane perpendicular to the optical axis of the projection optical system 6, that is, in the X-Y plane and be rotatable in the $\theta Z$ direction while holding the original 1. A driving mechanism (not shown) such as a linear motor drives the original stage 2.

A mirror 7 is provided on the original stage 2. A laser interferometer 9 is provided at a position facing the mirror 7. The laser interferometer 9 measures in real time the two-dimensional position and rotation angle of the original stage 2 (the original 1 held by the original stage 2), and outputs the measurement result to the control unit 17. The control unit 17 controls the driving mechanism based on the measurement result of the laser interferometer 9, and positions the original 1 held by the original stage 2.

The projection optical system 6 includes a plurality of optical elements, and projects the pattern of the original 1 to the substrate 3 at a predetermined projection magnification $\beta$. In this embodiment, the projection optical system 6 is a reduction optical system having the projection magnification $\beta$ of, for example, ¼ or ⅕.

The substrate stage 4 includes a Z stage that holds the substrate 3 via a chuck, an X-Y stage that supports the Z stage, and a base that supports the X-Y stage. A driving mechanism 18 including a linear motor and the like drives the substrate stage 4.

A mirror 8 is provided on the substrate stage 4.

Laser interferometers 10 and 12 for measuring the position of the substrate stage 4 are provided at positions facing the mirror 8. The laser interferometer 10 measures positions of the substrate stage 4 in the X direction, Y direction, and $\theta Z$ direction in real time, and outputs the measurement result to the control unit 17. The laser interferometer 12 measures positions of the substrate stage 4 in the Z direction, $\theta X$ direction, and $\theta Y$ direction in real time, and outputs the measurement result to the control unit 17. The control unit 17 controls the driving mechanism 18 based on the measurement results of the laser interferometers 10 and 12, thereby positioning the substrate 3 held by the substrate stage 4.

Figure 2:
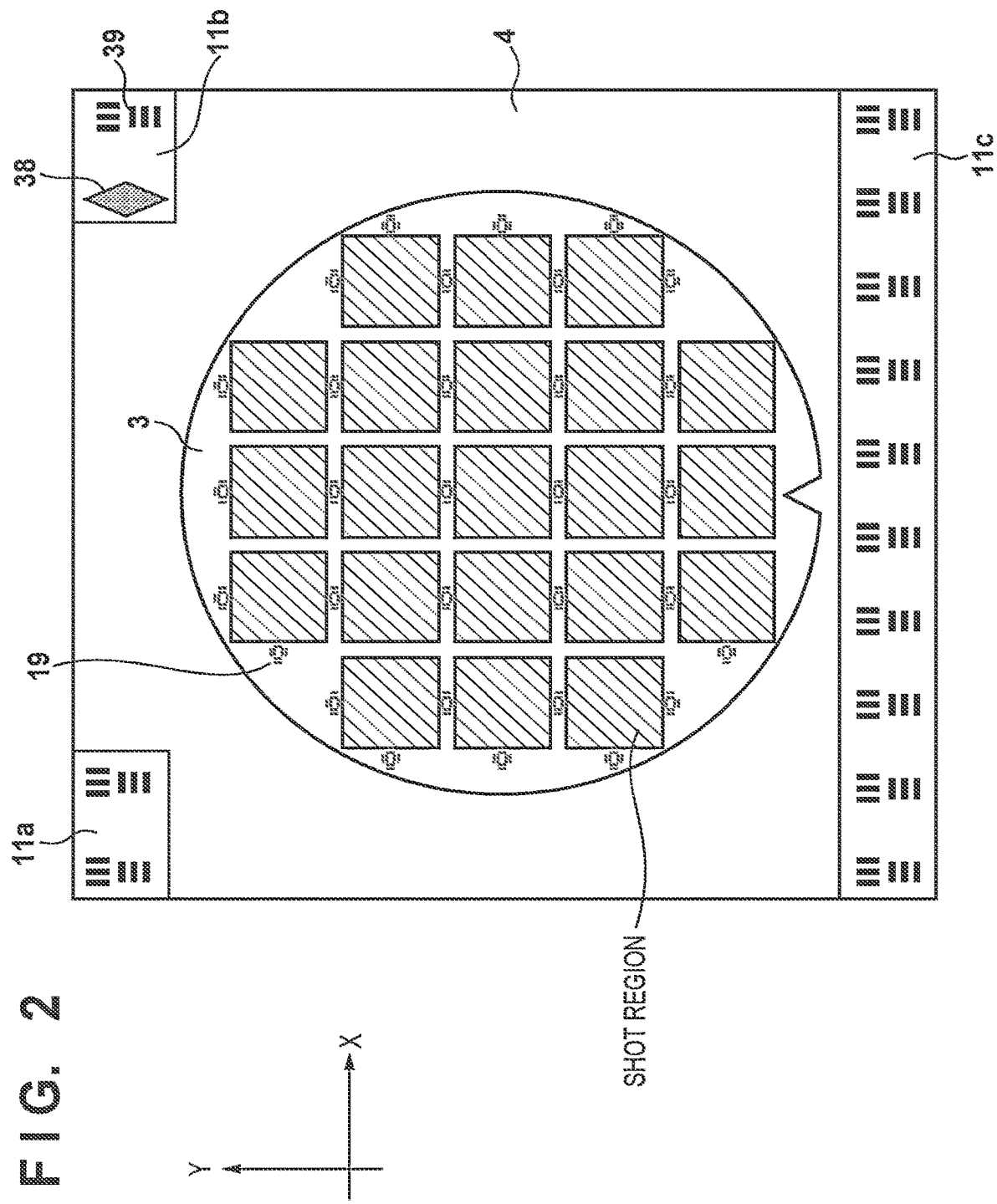
FIG. 2 is a view illustrating detailed configurations of a stage reference plate.

A stage reference plate 11 is provided on the substrate stage 4 so as to be almost flush with the surface of the substrate 3 held by the substrate stage 4. FIG. 2 is a view illustrating the detailed configurations of the stage reference plate 11 (11a, 11b, and 11c) provided on the substrate stage 4. The stage reference plate 11 may be provided at one corner of the substrate stage 4, or may be provided at each of a plurality of corners of the substrate stage 4. Alternatively, the stage reference plate 11 may be provided along a side of the substrate stage 4. In this embodiment, as illustrated in FIG. 2, three stage reference plates 11a, 11b, and 11c are provided on the substrate stage 4.

As illustrated in FIG. 2, the stage reference plate 11 includes a position detection system reference mark 39 to be detected by a position detection system 42, and a reference mark 38 to be detected by an original alignment detection system 13 or 14. The stage reference plate 11 may include a plurality of the reference marks 38 and a plurality of the reference marks 39. The positional relationship (X and Y directions) between the reference mark 38 and the reference mark 39 is set to a predetermined positional relationship (that is, it is known). Note that the reference mark 38 and the reference mark 39 may be common marks.

The original alignment detection system 13 is provided near the original stage 2. The original alignment detection system 13 detects an original reference mark (not shown) provided on the original 1 held by the original stage 2, and the reference mark 38 provided on the stage reference plate 11 on the substrate stage through the projection optical system 6. The original alignment detection system 13 detects the original reference mark provided on the original 1, and the reference mark 38 through the projection optical system 6 by using the same light source as one used when actually exposing the substrate 3. More specifically, the original alignment detection system 13 detects, by an image sensor (for example, a photoelectric conversion element such as a CCD camera), beams reflected by the original reference mark and the reference mark 38 (reflective mark). The original 1 and the substrate 3 are aligned based on a detection signal from the image sensor. At this time, the position and focus are adjusted between the original reference mark provided on the original 1 and the reference mark 38 provided on the stage reference plate 11. As a result, the relative positional relationship (X, Y, and Z) between the original 1 and the substrate 3 can be adjusted.

The original alignment detection system 14 is provided on the substrate stage 4. The original alignment detection system 14 is a transmission detection system and is used when the reference mark 38 is a transmission mark. The original alignment detection system 14 detects the original reference mark provided on the original 1 and the reference mark 38 provided on the stage reference plate 11 by using the same light source as one used when actually exposing the substrate 3. More specifically, the original alignment detection system 14 detects, by a light amount sensor, the transmitted light having passed through the original reference mark and the reference mark 38. At this time, the original alignment detection system 14 detects the amount of transmitted light while moving the substrate stage 4 in the X direction (or Y direction) and the Z direction. Accordingly, the position and focus can be adjusted between the original reference mark provided on the original 1 and the reference mark 38 provided on the stage reference plate 11.

In this way, the original alignment detection system 13 or the original alignment detection system 14 can be arbitrarily used to adjust the relative positional relationship (X, Y, and Z) between the original 1 and the substrate 3.

A focus detection system 15 includes a light projecting system that obliquely projects light to the surface of the substrate 3, and a light receiving system that receives light reflected by the surface of the substrate 3. The focus detection system 15 detects the Z-direction (height-direction) position of the substrate 3, and outputs the detection result to the control unit 17. The control unit 17 controls the driving mechanism 18 based on the detection result of the focus detection system 15 to adjust the Z-direction position and inclination angle of the substrate 3 held by the substrate stage 4.

As will be described later, a substrate alignment detection system 16 is formed from a plurality of position detection systems 42 each including an illumination system and a light receiving system. The illumination system illuminates an alignment mark 19 provided on the substrate 3 and the reference mark 39 provided on the stage reference plate 11 with light. The light receiving system receives light (reflected light) from the alignment mark 19 provided on the substrate 3, and light (reflected light) from the reference mark 39 provided on the stage reference plate 11. The substrate alignment detection system 16 detects the alignment mark 19 and the reference mark 39, and outputs the results to the control unit 17. The control unit 17 controls the driving mechanism 18 based on the detection result of the substrate alignment detection system 16 to drive the substrate stage 4, thereby adjusting the X- and Y-direction positions of the substrate 3 held by the substrate stage 4.

In general, the arrangement of the substrate alignment detection system is roughly divided into two: an off-axis alignment (OA) detection system and a Through The Lens alignment (TTL) detection system. The OA detection system optically detects an alignment mark provided on a substrate without the intervention of a projection optical system. The TTL detection system detects an alignment mark provided on a substrate through a projection optical system by using light (non-exposure light) different in wavelength from exposure light. Although the substrate alignment detection system 16 is the OA detection system in this embodiment, the present invention does not limit the alignment detection method. For example, when the substrate alignment detection system 16 is the TTL detection system, it detects the alignment mark 19 provided on the substrate 3 through the projection optical system 6. Except this, the basic arrangement is similar to that of the OA detection system.

Figure 3:
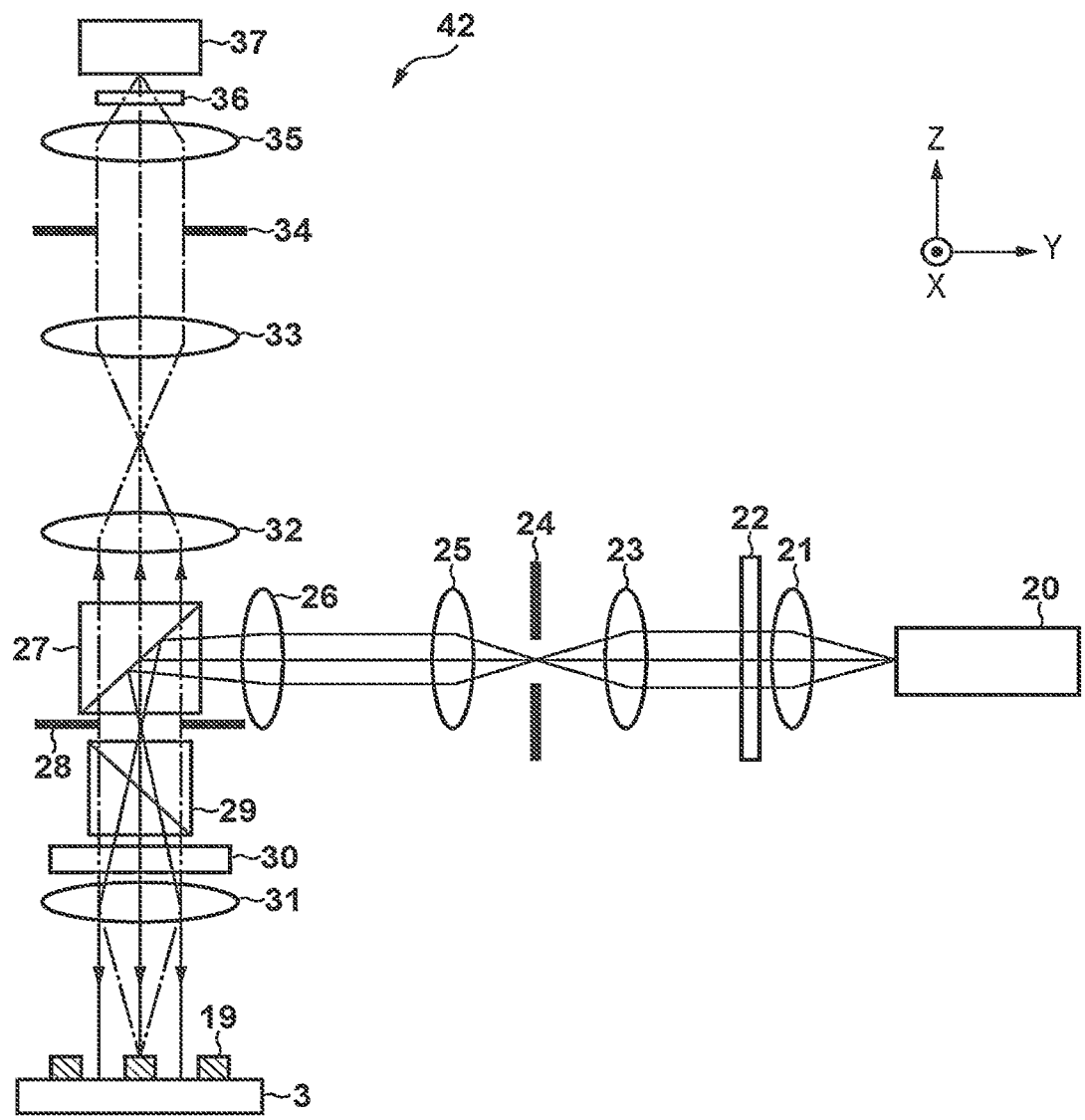
FIG. 3 is a schematic view illustrating detailed configurations of a position detection system.

FIG. 3 is a schematic view illustrating the detailed configurations of the substrate alignment detection system 16, more specifically, one position detection system 42 forming the substrate alignment detection system 16. The position detection system 42 includes a light source 20, a first condenser optical system 21, a wavelength filter plate 22, a second condenser optical system 23, an aperture stop plate 24, a first illumination system 25, a second illumination system 26, a polarizing beam splitter 27, and an NA stop 28. The position detection system 42 also includes an AF prism 29, a $\lambda/4$ plate 30, an objective lens 31, a relay lens 32, a first imaging system 33, an aperture stop 34, a second imaging system 35, a wavelength shift difference adjustment optical member 36, and a photoelectric conversion element 37.

In this embodiment, the light source 20 emits visible light (for example, light having a wavelength of 500 nm to 700 nm), light of the blue wavelength (for example, light having a wavelength of 450 nm to 550 nm (blue wavelength light)), and infrared light (for example, light having a wavelength of 700 nm to 1,500 nm). The light emitted by the light source 20 passes through the first condenser optical system 21, the wavelength filter plate 22, and the second condenser optical system 23, and reaches the aperture stop plate 24 positioned on the pupil plane (optical Fourier transform plane with respect to the object plane) of the position detection system 42.

The wavelength filter plate 22 includes a plurality of wavelength filters different in the wavelength band of light to be transmitted. One wavelength filter is selected from the plurality of wavelength filters under the control of the control unit 17, and is inserted in the optical path of the position detection system 42. In this embodiment, the wavelength filter plate 22 includes a wavelength filter that transmits infrared light, a wavelength filter that transmits visible light, and a wavelength filter that transmits blue wavelength light. By switching between these wavelength filters in the wavelength filter plate 22, the wavelength band of light for illuminating the alignment mark 19 provided on the substrate 3 can be selected. The wavelength filter plate 22 may be configured so that a new wavelength filter can be added in addition to the plurality of wavelength filters provided in advance.

The aperture stop plate 24 includes a plurality of aperture stops different in illumination σ. The aperture stop plate 24 can change the illumination σ of light for illuminating the alignment mark 19 by switching an aperture stop to be inserted in the optical path of the position detection system 42 under the control of the control unit 17. The aperture stop plate 24 may be configured so that a new aperture stop can be added in addition to the plurality of aperture stops provided in advance.

Light that has arrived at the aperture stop plate 24 is guided to a polarizing beam splitter 27 through the first illumination system 25 and the second illumination system 26. Of the light guided to the polarizing beam splitter 27, S-polarized light perpendicular to the paper surface of the drawing is reflected by the polarizing beam splitter 27, passes through the NA stop 28, the AF prism 29, and the $\lambda/4$ plate 30, and converted into circularly polarized light. The light (illumination light) having passed through the $\lambda/4$ plate 30 illuminates the alignment mark 19 provided on the substrate 3 via the objective lens 31. The NA of the NA stop 28 can be changed by changing the aperture value under the control of the control unit 17.

The reflected light, diffracted light, and scattered light (detection light) from the alignment mark 19 pass through the objective lens 31 and the λ/4 plate 30, and are converted into P-polarized light parallel to the paper surface of the drawing. The P-polarized light is transmitted by the polarizing beam splitter 27 through the AF prism 29 and NA stop 28. The light transmitted by the polarizing beam splitter 27 reaches the photoelectric conversion element 37 (for example, an image sensor such as a CCD image sensor) through the relay lens 32, the first imaging system 33, the aperture stop 34, the second imaging system 35, and the wavelength shift difference adjustment optical member 36. The photoelectric conversion element 37 detects light from the alignment mark 19. The photoelectric conversion element 37 can extend the accumulation time until the intensity of received light exceeds a certain threshold value. The accumulation time of the photoelectric conversion element 37 is controlled by the control unit 17.

Figure 4B:
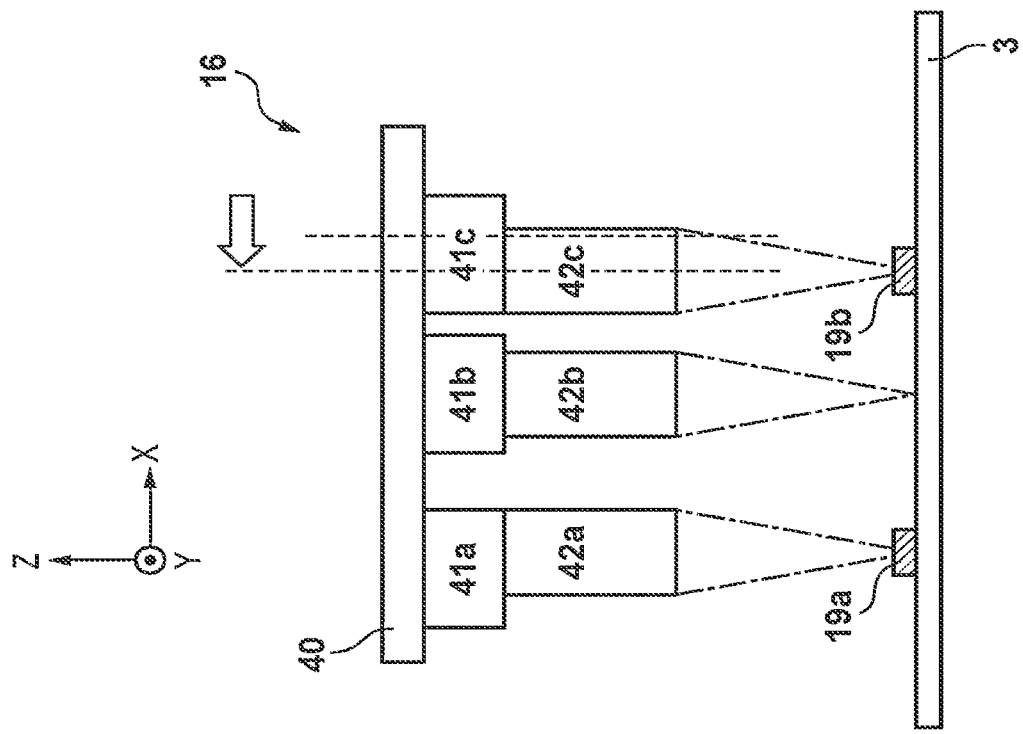
FIGS. 4A and 4B are views illustrating configurations of a substrate alignment detection system.
Figure 4A:
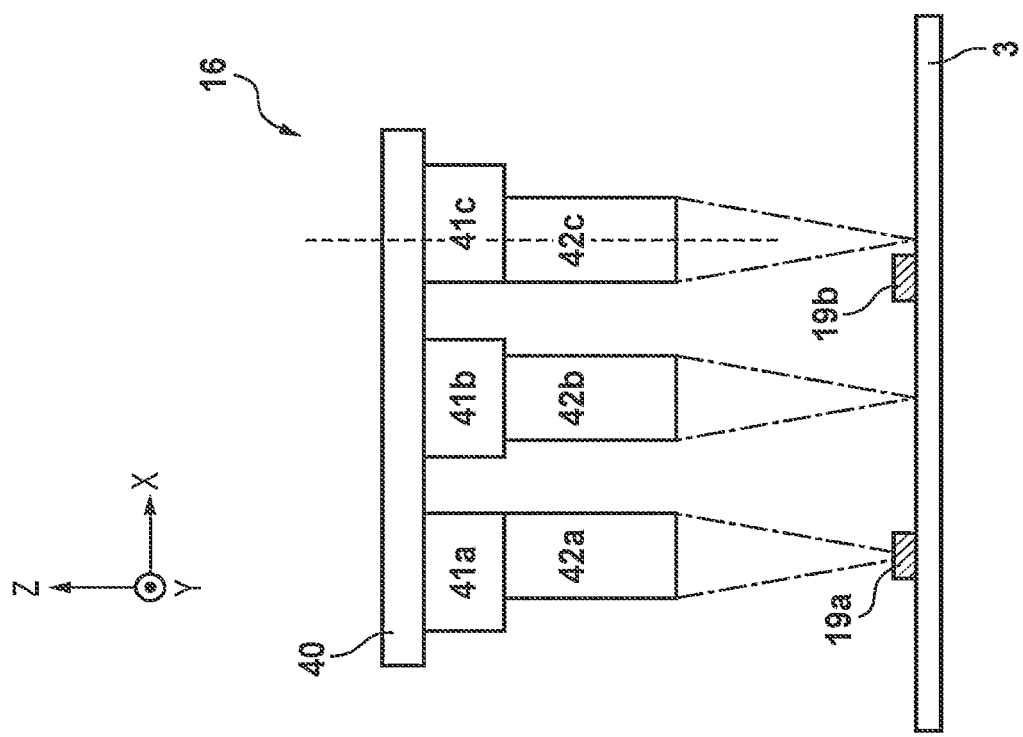

In the exposure apparatus 100, as has been described above, the substrate alignment detection system 16 is formed from the plurality of position detection systems 42 each including the components illustrated in FIG. 3. In other words, the substrate alignment detection system 16 forms a position detection system group formed from the plurality of position detection systems 42. In this embodiment, as illustrated in FIGS. 4A and 4B, the substrate alignment detection system 16 includes three position detection systems 42a, 42b, and 42c arranged spaced apart from each other so as to detect alignment marks different from each other. The position detection systems 42a, 42b, and 42c are held by a base plate 40 via driving units 41a, 41b, and 41c, respectively. The driving units 41a, 41b, and 41c drive the position detection systems 42a, 42b, and 42c to change the positions of the position detection systems 42a, 42b, and 42c with respect to the base plate 40, respectively. In other words, the driving units 41a, 41b, and 41c change the relative positional relationship among the position detection systems 42a, 42b, and 42c on the base plate 40.

Since the substrate alignment detection system 16 is formed from the plurality of position detection systems 42, it can simultaneously detect a plurality of alignment marks 19 provided on the substrate 3. The alignment marks 19 are generally provided on the substrate 3 at a repetition period corresponding to the array (shot layout) of shot regions on the substrate. Information regarding the array of the alignment marks 19 provided on the substrate 3 is stored in a storage unit included in the exposure apparatus 100, for example, a memory of the control unit 17.

Here, for example, referring to FIG. 4A, the position detection system 42c is driven in the X direction via the driving unit 41c under the control of the control unit 17 based on the information regarding the array of the alignment marks 19, more specifically, the interval information between an alignment mark 19a and an alignment mark 19b. Then, as illustrated in FIG. 4B, the alignment mark 19a is located below the position detection system 42a, and the alignment mark 19b is located below the position detection system 42c. Thus, the alignment marks 19a and 19b can be simultaneously detected. Note that in FIGS. 4A and 4B, two alignment marks 19a and 19b are provided on the substrate 3, but more alignment marks 19 may be provided on the substrate 3.

As illustrated in FIGS. 4A and 4B, the plurality of alignment marks 19 are provided on the substrate 3. The substrate alignment detection system 16 can obtain components such as the magnification, shift, and rotation of the substrate 3 by detecting the plurality of alignment marks 19 by the position detection systems 42, respectively. Particularly, in recent years, there is demand for detection of many alignment marks 19 to implement highly accurate alignment and improve overlay accuracy.

With reference to FIGS. 5 to 8, detection of the alignment marks 19 on the substrate by one position detection system 42 (monocular) will be described.

Figure 5:
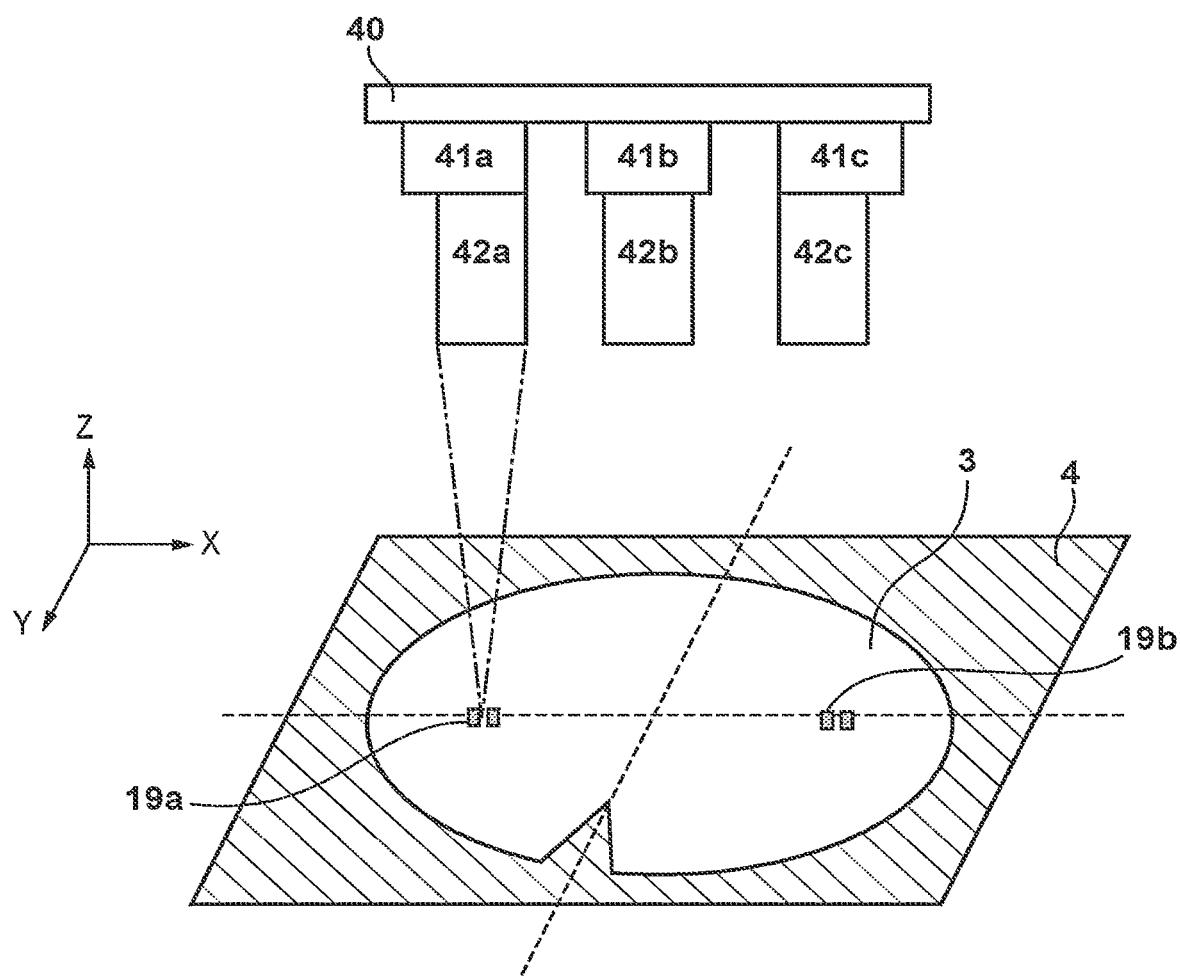
FIG. 5 is a view for explaining detection of alignment marks by one position detection system.
Figure 6:
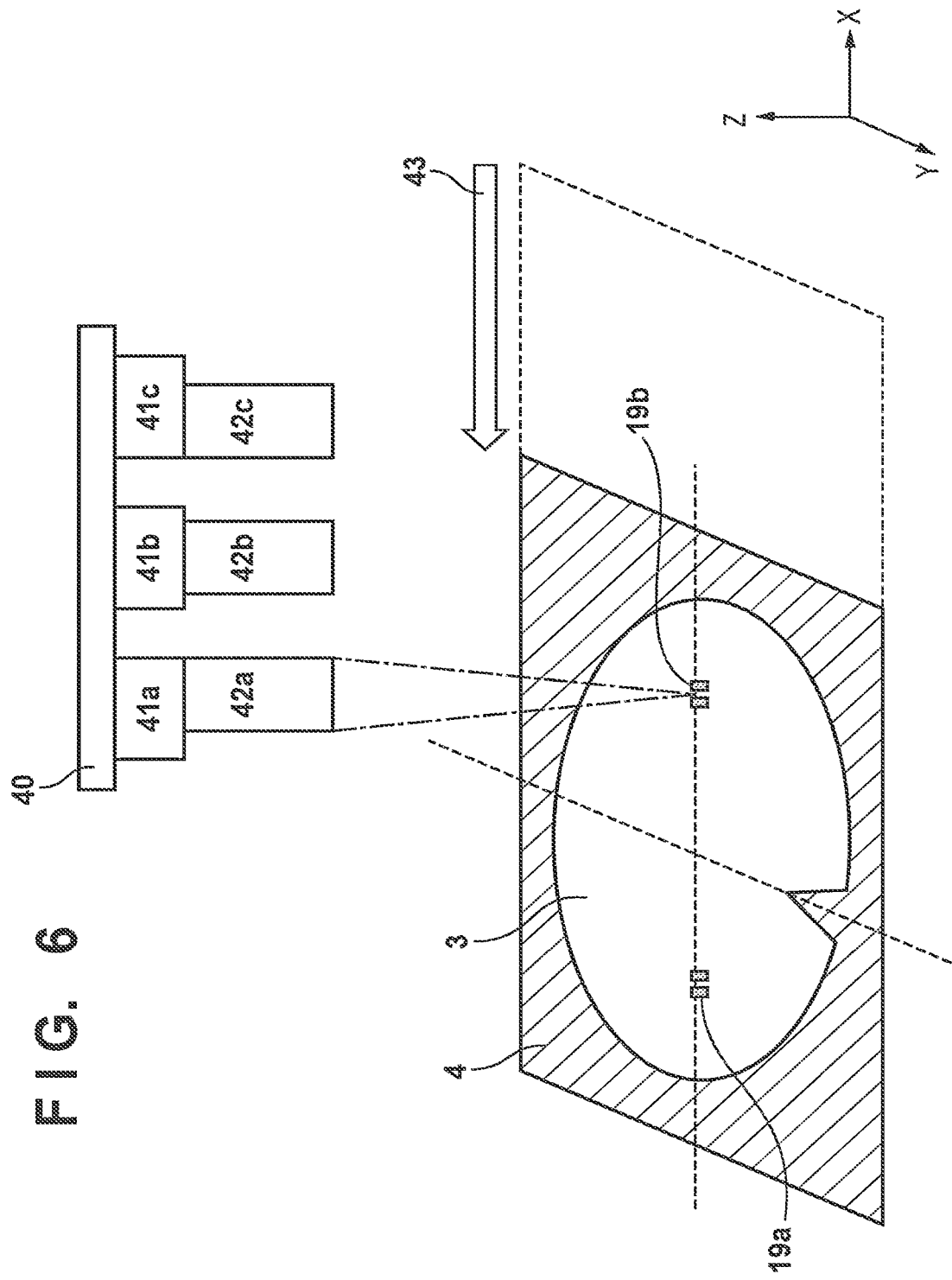
FIG. 6 is a view for explaining detection of alignment marks by one position detection system.

FIGS. 5 and 6 illustrate a sequence in which the position detection system 42a detects the alignment marks 19a and 19b in a state in which the substrate 3 is placed on the substrate stage 4 with no placement error (a state in which the substrate 3 is placed without being rotated). For the sake of descriptive convenience, two alignment marks 19 are provided on the substrate 3 in FIGS. 5 and 6, but three or more alignment marks 19 may be provided on the substrate 3. First, as illustrated in FIG. 5, the substrate stage 4 is driven to locate the left alignment mark 19a on the substrate below the position detection system 42a, and the position detection system 42a detects the alignment mark 19a. Then, as illustrated in FIG. 6, the substrate stage 4 is driven in the direction (X direction) indicated by an arrow 43 to locate the right alignment mark 19b on the substrate below the position detection system 42a, and the position detection system 42a detects the alignment mark 19b.

Figure 7:
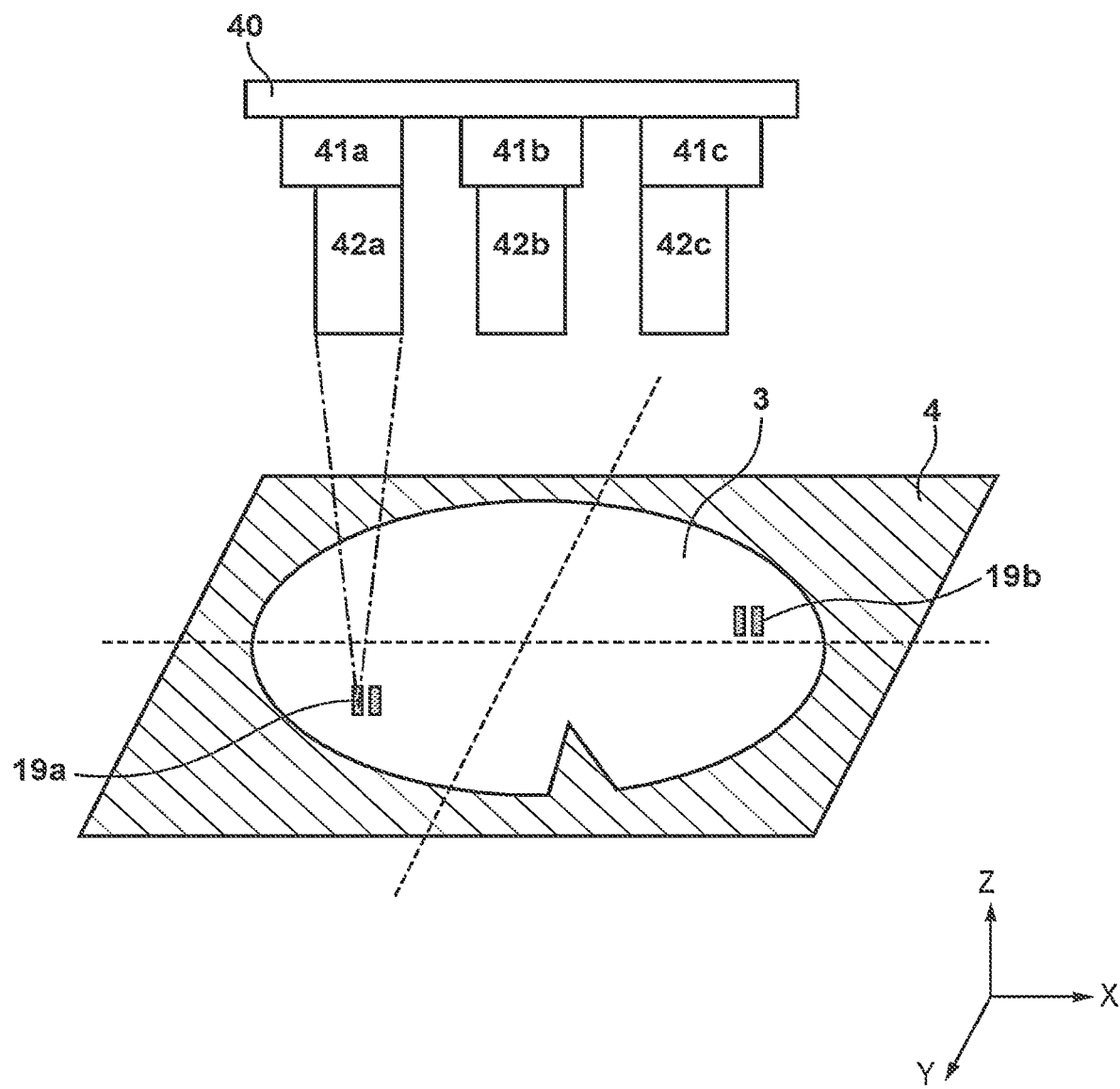
FIG. 7 is a view for explaining detection of alignment marks by one position detection system.
Figure 8:
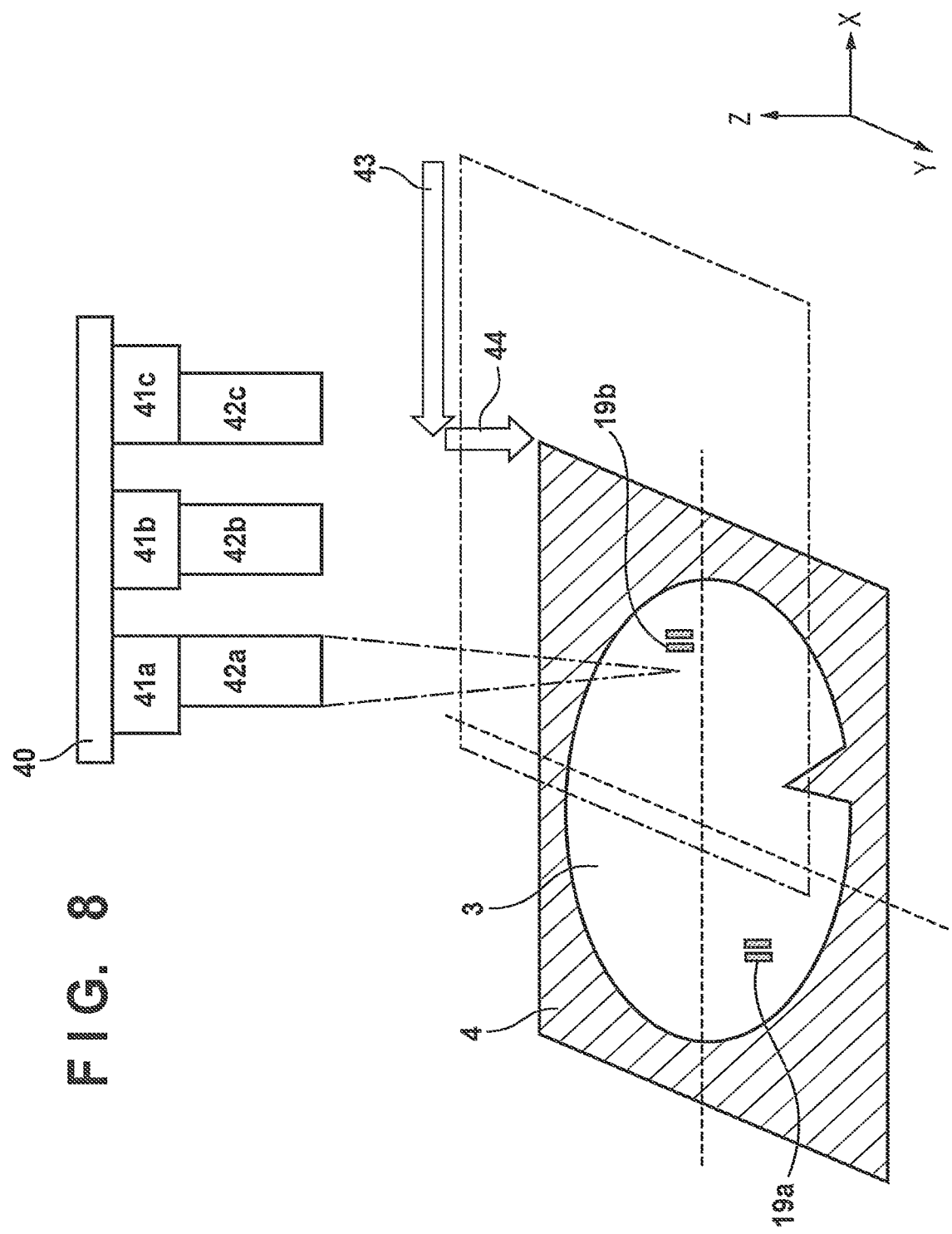
FIG. 8 is a view for explaining detection of alignment marks by one position detection system.

FIGS. 7 and 8 illustrate a sequence in which the position detection system 42a detects the alignment marks 19a and 19b in a state in which the substrate 3 is placed on the substrate stage 4 with a placement error (a state in which the substrate 3 is placed while being rotated). First, as illustrated in FIG. 7, the substrate stage 4 is driven to locate the left alignment mark 19a on the substrate below the position detection system 42a, and the position detection system 42a detects the alignment mark 19a. Then, as illustrated in FIG. 8, the substrate stage 4 is driven in the direction (X direction) indicated by the arrow 43 and the direction (Y direction) indicated by an arrow 44 to locate the right alignment mark 19b on the substrate below the position detection system 42a, and the position detection system 42a detects the alignment mark 19b.

Referring to FIGS. 5 to 8, in detection by one position detection system 42a, the alignment marks 19a and 19b can be located below the position detection system 42a only by driving the substrate stage 4 in the X direction and the Y direction regardless of whether the substrate 3 has a placement error. It can be seen that an error caused by θZ control (rotational driving) of the substrate stage 4 does not occur since the rotation angle of the substrate stage 4 with respect to the position detection system 42a is the same between FIGS. 5 and 6 or between FIGS. 7 and 8. In this manner, when monocularly detecting the plurality of alignment marks, there is a merit that the alignment marks can be detected without an error caused by θZ control of the substrate stage 4 since the rotation angle of the substrate stage 4 does not change. On the other hand, since it is necessary to drive the substrate stage 4 upon detecting each alignment mark, it takes time to detect the alignment marks. Accordingly, there is a demerit that throughput is degraded.

Simultaneous detection of the alignment marks 19 on the substrate by two position detection systems 42 (binocular (two views)) will be described below.

Figure 9:
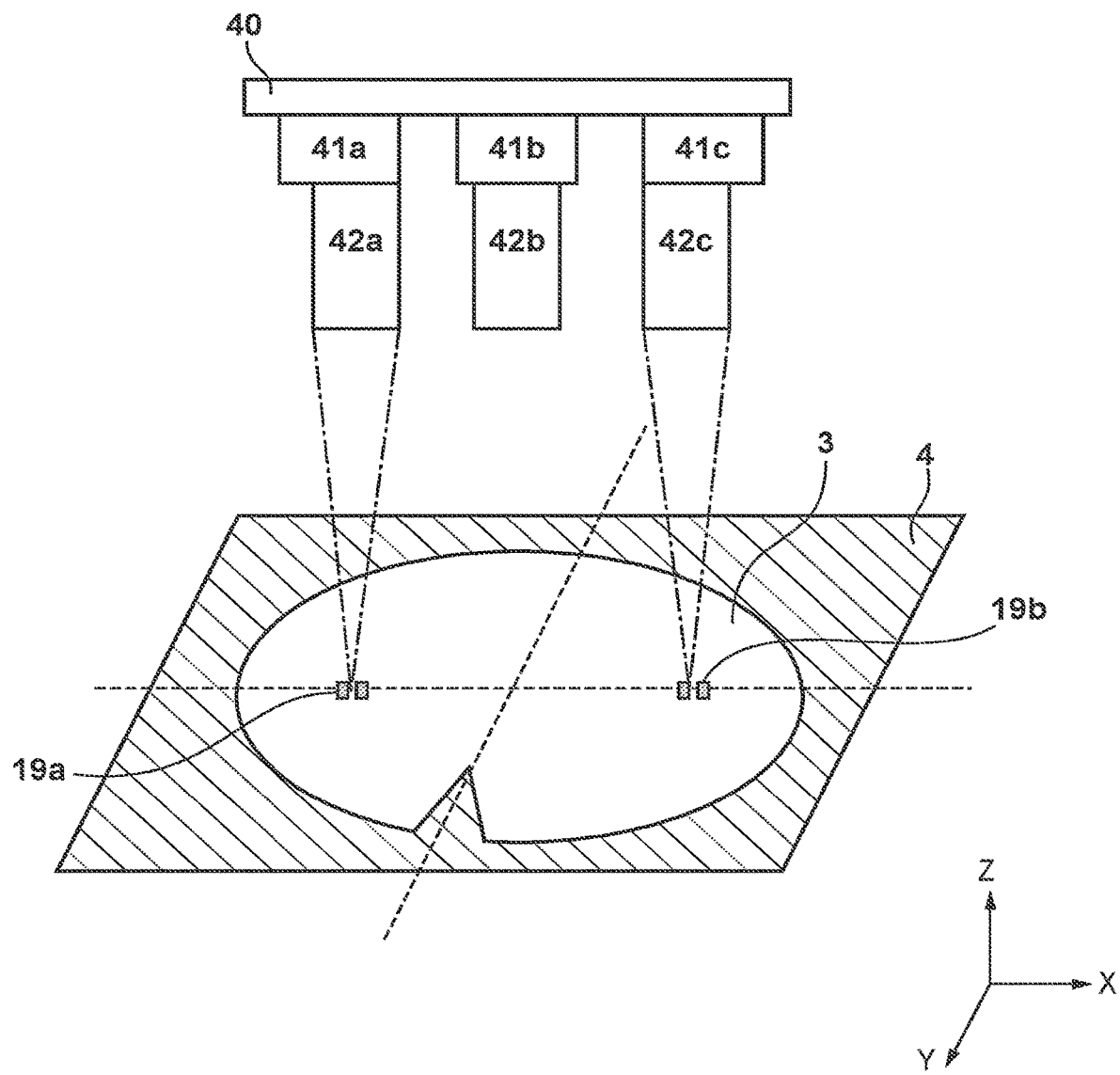
FIG. 9 is a view for explaining simultaneous detection of alignment marks by two position detection systems.

FIG. 9 illustrates a sequence in which the position detection systems 42a and 42c detect the alignment marks 19a and 19b, respectively, in a state in which the substrate 3 is placed on the substrate stage 4 with no placement error (a state in which the substrate 3 is placed without being rotated). First, the substrate stage 4 is driven to locate the left alignment mark 19a on the substrate below the position detection system 42a. Then, the position detection system 42c is driven via the driving unit 41c to locate the right alignment mark 19b on the substrate below the position detection system 42c (to locate the position detection system 42c above the alignment mark 19b). With this operation, as illustrated in FIG. 9, the position detection system 42a and the position detection system 42c can simultaneously detect the alignment mark 19a and the alignment mark 19b, respectively. Hence, as compared to a case in which one position detection system 42a detects the alignment marks 19a and 19b (FIGS. 5 and 6), it is unnecessary to drive the substrate stage 4 in the direction indicated by the arrow 43, and the alignment marks 19a and 19b can be detected in a short time. Note that in practice, the driving unit 41c drives the position detection system 42c in accordance with the shot layout of the substrate 3 before the substrate stage 4 is driven to locate the alignment mark 19a below the position detection system 42a. In other words, the interval between the position detection system 42a and the position detection system 42c is adjusted in advance based on the interval between the alignment mark 19a and the alignment mark 19b.

Figure 10:
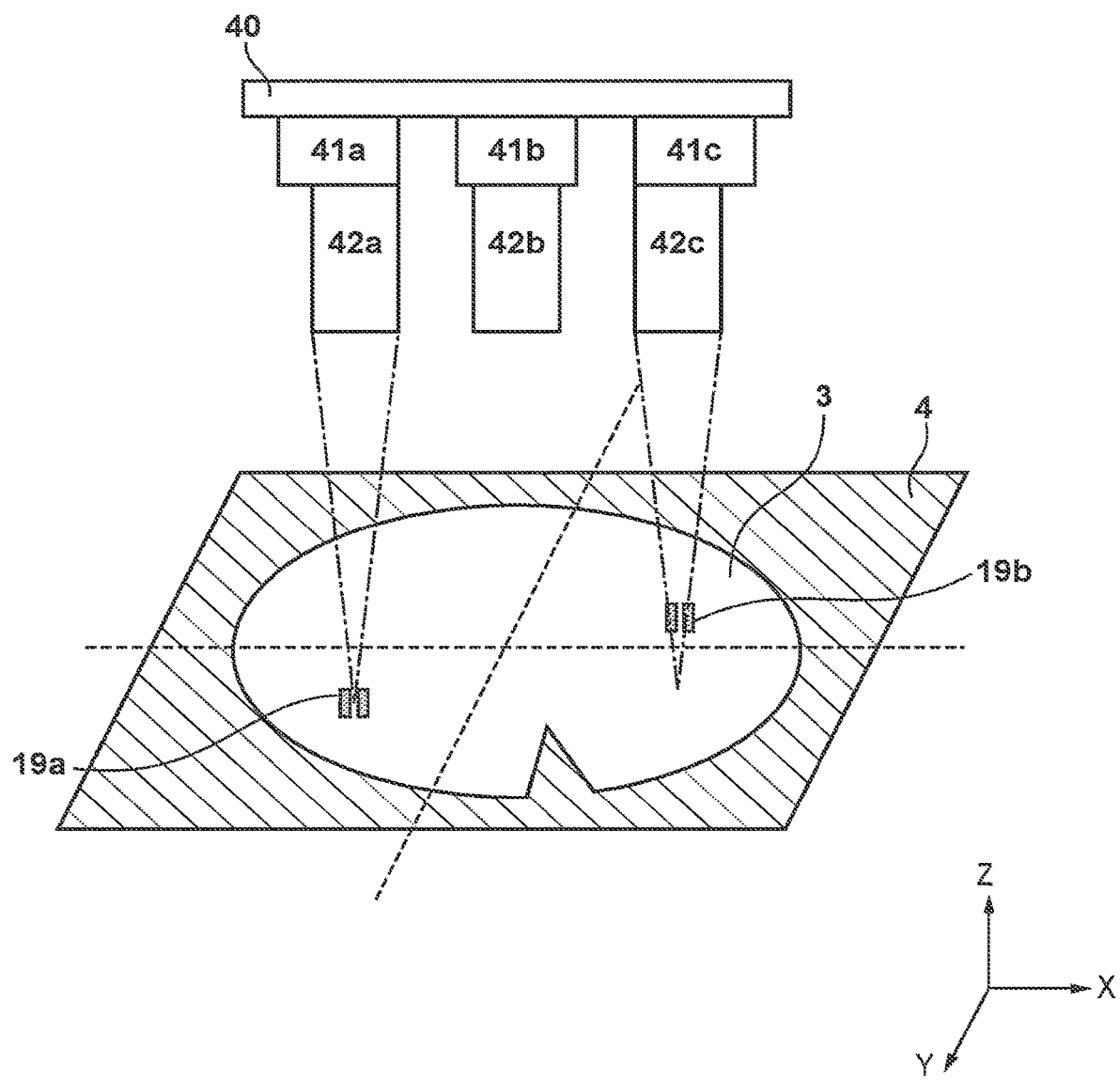
FIG. 10 is a view for explaining simultaneous detection of alignment marks by two position detection systems.
Figure 11:
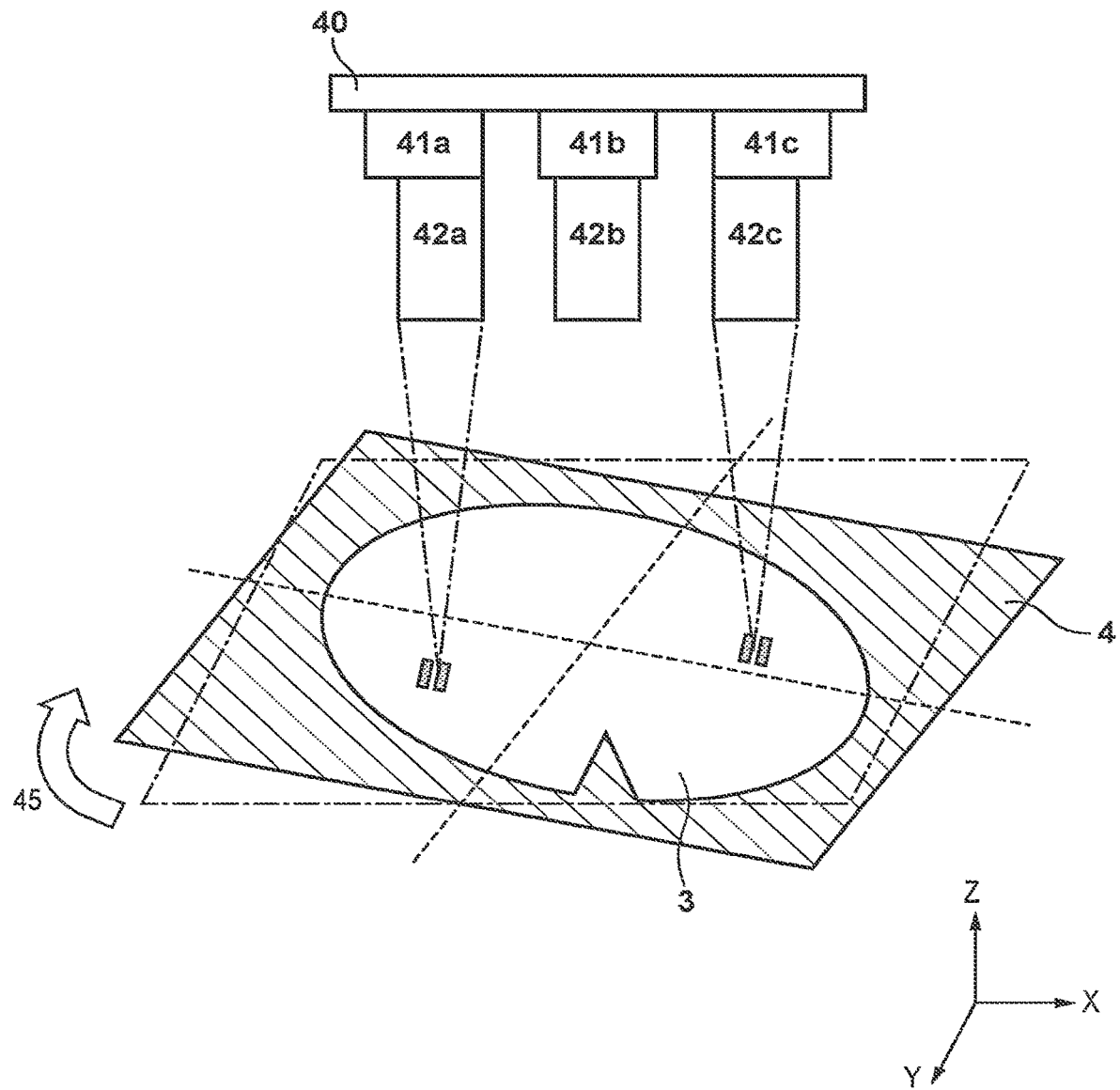
FIG. 11 is a view for explaining simultaneous detection of alignment marks by two position detection systems.

FIG. 9 assumes an ideal state in which the substrate 3 is placed on the substrate stage 4 with no placement error. However, in practice, as illustrated in FIGS. 10 and 11, a state often occurs in which the substrate 3 is placed on the substrate stage 4 with a placement error (a state in which the substrate 3 is placed while being rotated). Therefore, the alignment marks (for example, the alignment marks 19a and 19b) cannot be readily simultaneously detected by the binocular (for example, the position detection systems 42a and 42c).

FIG. 10 illustrates a sequence in which the position detection systems 42a and 42c detect the alignment marks 19a and 19b, respectively, in a state in which the substrate 3 is placed on the substrate stage 4 with a placement error (a state in which the substrate 3 is placed while being rotated). In FIG. 10, the position detection system 42c is driven via the driving unit 41c in advance such that the interval (design value) between the alignment mark 19a and the alignment mark 19b matches the interval between the position detection system 42a and the position detection system 42c.

First, as illustrated in FIG. 10, the substrate stage 4 is driven to locate the left alignment mark 19a on the substrate below the position detection system 42a. At this time, since the substrate 3 has been rotated with respect to the substrate stage 4, the right alignment mark 19b on the substrate cannot be located below the position detection system 42c only by driving the position detection system 42c in accordance with the interval between the alignment marks 19a and 19b. Accordingly, the position detection systems 42a and 42c cannot simultaneously detect the alignment marks 19a and 19b, respectively.

Therefore, as illustrated in FIG. 11, the substrate stage 4 is rotated in the direction (θZ direction) indicated by an arrow 45 from the state illustrated in FIG. 10. With this operation, the alignment mark 19b can be located below the position detection system 42c while maintaining the state in which the alignment mark 19a is located below the position detection system 42a. In this manner, by making a state in which the alignment marks 19a and 19b are located below the position detection systems 42a and 42c, respectively, the alignment marks 19a and 19b can be simultaneously detected.

As has been described above, when the substrate 3 is placed while being rotated with respect to the substrate stage 4, in general, the substrate stage 4 is rotated in the θZ direction to simultaneously detect the alignment marks 19a and 19b by the position detection systems 42a and 42c, respectively. However, a problem occurs that the detection result of the alignment mark 19 in the case of rotating the substrate stage 4 in the θZ direction (FIG. 11) is not completely coincident with that in the case of not rotating the substrate stage 4 in the θZ direction (FIGS. 5 to 9).

As has been described above, the position of the substrate stage 4 is controlled based on the measurement results of the laser interferometers 10 and 11. As compared to driving correction of the substrate stage 4 in the X direction and Y direction (FIGS. 5 to 9), driving correction of the substrate stage 4 in the θZ direction (FIG. 11) is difficult, and these driving correction operations cannot be performed with the same accuracy. This is because the position of the substrate stage 4 is controlled by applying light from the laser interferometer 10 to the mirror 8 on the substrate stage and detecting return light from the mirror 8, but more errors occur in θZ-direction correction than in X-direction and Y-direction correction.

More specifically, as illustrated in FIGS. 5 to 9, if driving correction of the substrate stage 4 is performed only in the X direction and the Y direction, the substrate stage 4 is controlled such that the return light from the mirror 8 returns to the same position with respect to the laser interferometer 10 regardless of the position of the substrate stage 4. Possible errors in this case include the shape of the mirror 8 on the substrate stage, air fluctuations from the mirror 8 to the laser interferometer 10, and the like.

On the other hand, when the substrate stage 4 is driven to rotate in the θZ direction as illustrated in FIG. 11, light from the laser interferometer 10 is not perpendicularly applied to the mirror 8 on the substrate stage 4. Accordingly, the light returning to the laser interferometer 10 from the mirror 8 is largely shifted. It is desirable to accurately measure the rotation of the substrate stage 4 in the θZ direction by the laser interferometer 10 and correct the position of the substrate stage 4. However, in practice, due to the influence of the measurement error or tilt in the X direction, the position of the substrate stage 4 cannot be accurately corrected and an Abbe error occurs.

In this manner, as compared to driving correction of the substrate stage 4 in the X direction and the Y direction (FIGS. 5 to 9), an Abbe error occurs in driving correction of the substrate stage 4 in the θZ direction (FIG. 11). Accordingly, it is impossible to perform driving correction in the θZ direction with the same accuracy as in driving correction in the X direction and the Y direction. Further, it is also known that there is an Abbe error dependent on the coordinates (position) of the substrate stage 4. Thus, there is also a problem that the Abbe error changes in accordance with the shot region of the substrate 3.

Figure 12:
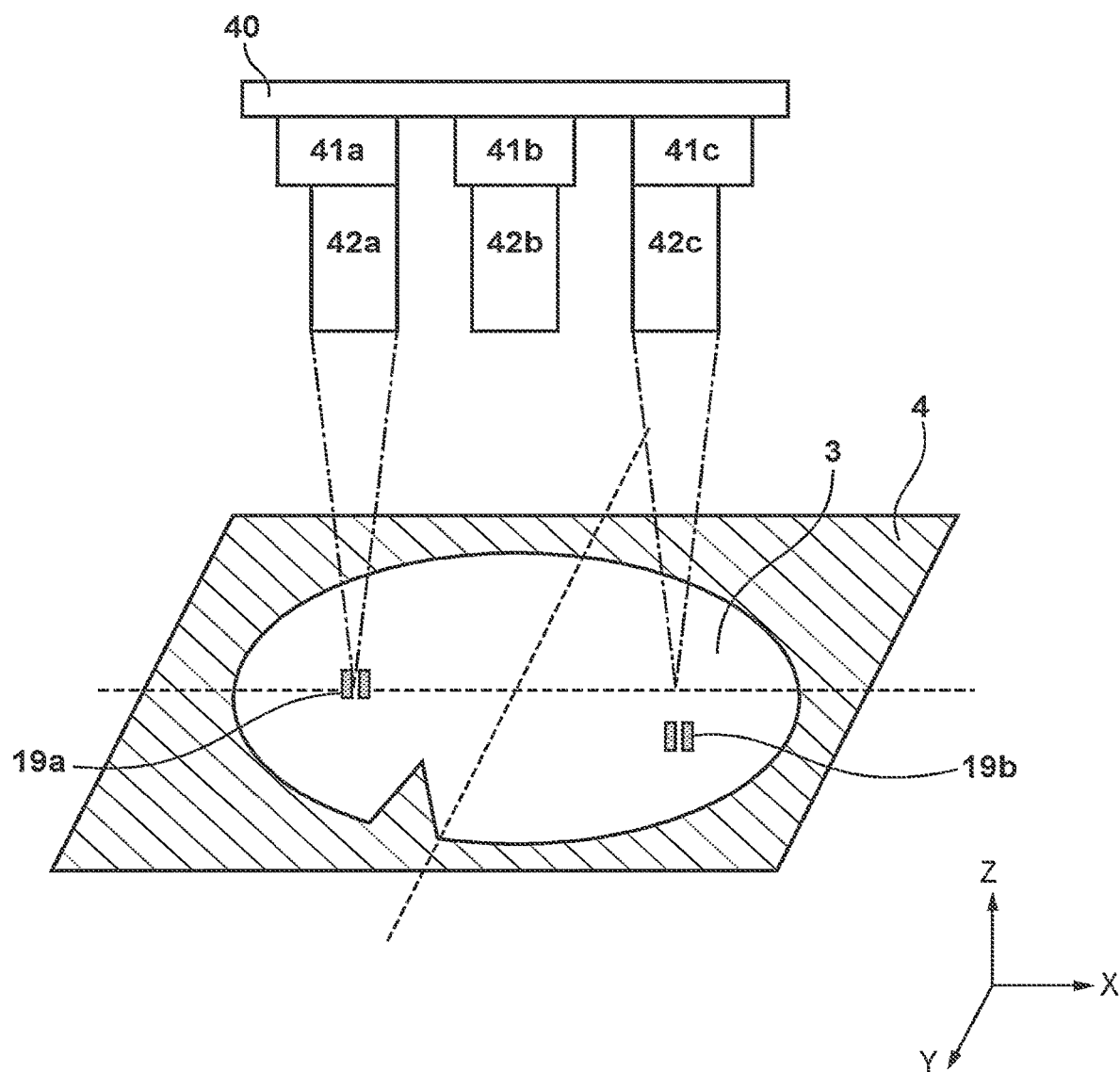
FIG. 12 is a view for explaining simultaneous detection of alignment marks by two position detection systems.

Further, for example, even if the alignment mark 19a is located below the position detection system 42a as illustrated in FIG. 10, the placement (arrangement) state of the substrate 3 with respect to the substrate stage 4 may change between the first substrate 3 and the second or subsequent substrate 3. FIG. 12 illustrates an example of a state in which the second or subsequent substrate 3 is placed on the substrate stage 4. Referring to FIG. 12, it can be seen that when the alignment mark 19a is located below the position detection system 42a, the substrate 3 is placed with a rotation (tilt) different from that in the state (placement state) illustrated in FIG. 10. When the substrate 3 is placed in the substrate stage 4 in the state illustrated in FIG. 12, in order to simultaneously detect the alignment marks 19a and 19b by the position detection systems 42a and 42c, respectively, it is necessary to rotate the substrate stage 4 at an angle different from that in the state illustrated in FIG. 11.

Figure 13:
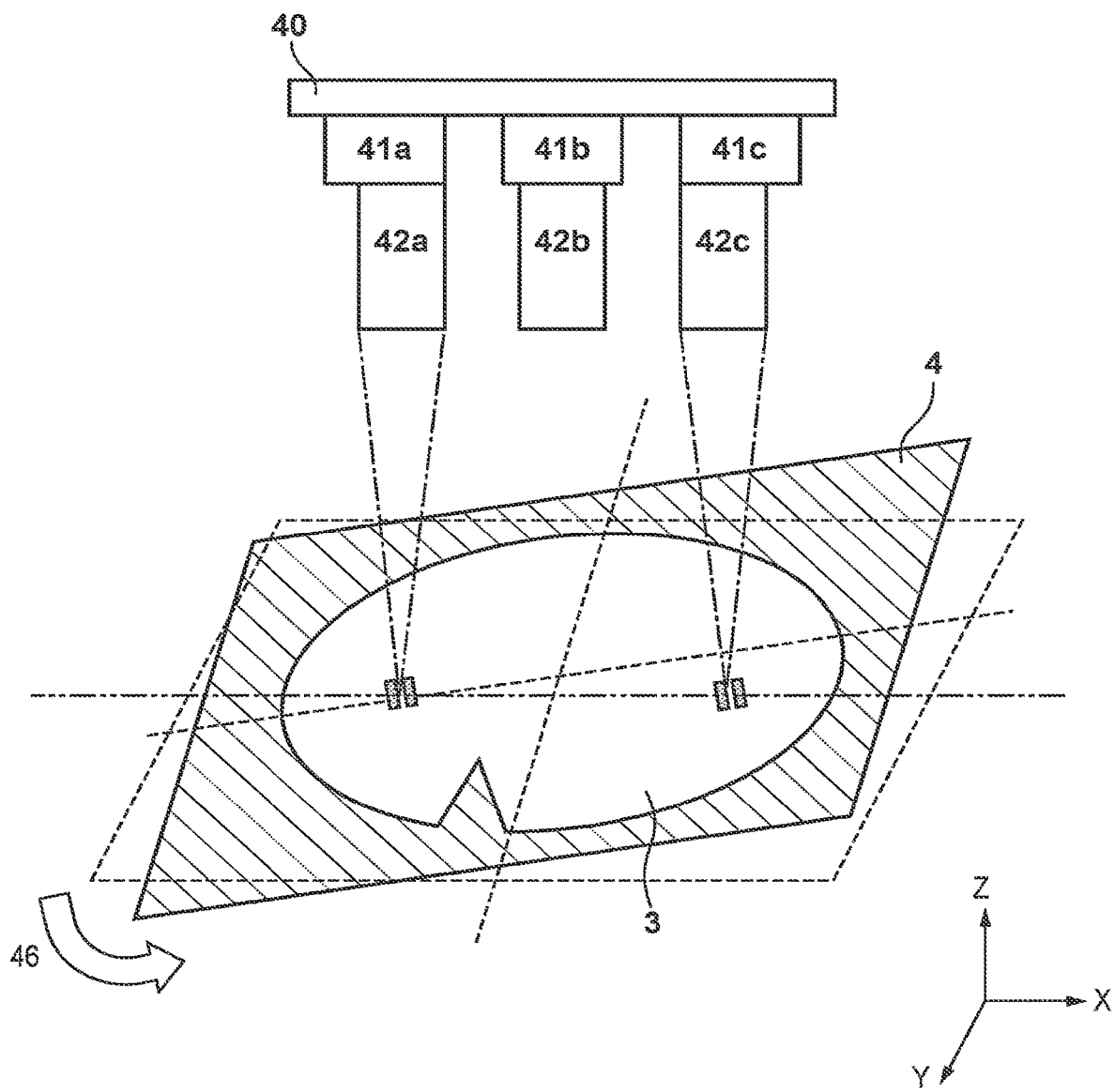
FIG. 13 is a view for explaining simultaneous detection of alignment marks by two position detection systems.

For example, as illustrated in FIG. 12, the substrate stage 4 is driven to locate the left alignment mark 19a on the substrate below the position detection system 42a. Note that the position detection system 42c is driven via the driving unit 41c in advance such that the interval (design value) between the alignment mark 19a and the alignment mark 19b matches the interval between the position detection systems 42a and the position detection system 42c. In this case, since the substrate 3 is rotated with respect to the substrate stage 4, the right alignment mark 19b on the substrate cannot be located below the position detection system 42c only by driving the position detection system 42c in accordance with the interval between the alignment marks 19a and 19b. Therefore, when the substrate 3 is placed on the substrate stage 4 in the state illustrated in FIG. 12, the substrate stage 4 is rotated in the direction ($\theta Z$ direction) indicated by an arrow 46 as illustrated in FIG. 13. In this manner, by making a state in which the alignment marks 19a and 19b are located below the position detection systems 42a and 42c, respectively, the alignment marks 19a and 19b can be simultaneously detected.

Referring to FIGS. 11 and 13, it can be seen that in order to simultaneously detect the alignment marks 19a and 19b by the position detection systems 42a and 42c, respectively, the rotation direction or rotation amount of the substrate stage 4 is changed in accordance with the placement state of the substrate 3 with respect to the substrate stage 4. If the rotation direction and rotation amount of the substrate stage 4 is changed, this may result in an error in driving correction of the substrate stage 4 by the laser interferometers 10 and 12, and cause an error in simultaneous detection of the alignment marks 19 on the substrate by two position detection systems 42 (binocular (two views)).

To prevent this, in this embodiment, there is provided a technique for constantly performing simultaneous detection of the alignment marks 19 on the substrate by the plurality of position detection systems 42 with high accuracy regardless of the placement error (shift or $\theta Z$) of the substrate 3 with respect to the substrate stage 4. With this technique, it is possible to achieve an improvement in overlay accuracy and high throughput without being affected by a placement error of the substrate 3 with respect to the substrate stage 4 while using the plurality of position detection systems 42.

Figure 14:
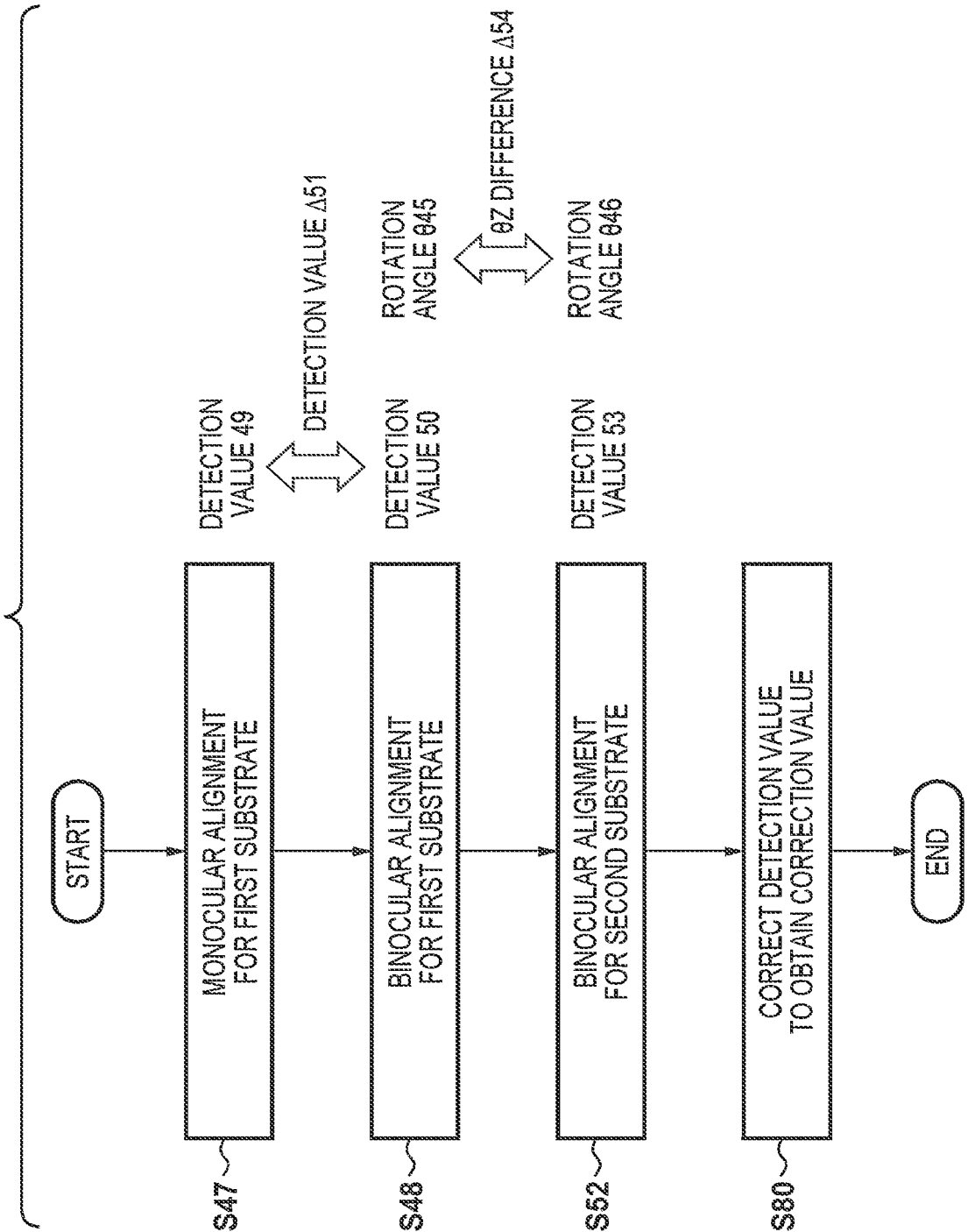
FIG. 14 is a flowchart for explaining simultaneous detection of alignment marks 19 by two position detection systems according to an embodiment.

With reference to FIG. 14, simultaneous detection (detection method) of the alignment marks 19 by two position detection systems 42 according to this embodiment will be described. Simultaneous detection of the alignment marks 19 by two position detection systems 42 is performed by the control unit 17 comprehensively controlling the position detection systems 42 (substrate alignment detection system 16) and the substrate stage 4. Accordingly, the substrate stage 4, the position detection systems 42, and the control unit 17 function as a detection apparatus that detects the alignment marks 19 provided on the substrate 3.

In step S47, a process (monocular alignment for the first substrate) is performed in which the plurality of alignment marks 19 provided on the first substrate 3 are detected by one position detection system 42 (monocular) of the plurality of position detection systems 42 to obtain the detection values of the respective alignment marks 19. More specifically, if the substrate 3 is placed while being rotated with respect to the substrate stage 4 as illustrated in FIGS. 7 and 8, the one position detection system 42a detects the alignment marks 19a and 19b while driving the substrate stage 4 in the X direction and the Y direction. Here, the detection value of one alignment mark (for example, the alignment mark 19a) of the alignment marks 19a and 19b is referred to as a detection value 49.

In this manner, step S47 corresponds to a first process of obtaining a first detection value by detecting the plurality of alignment marks 19 by one or more detection systems 42 of the plurality of position detection systems 42 in a first state in which the substrate stage 4 is arranged at a first rotation angle. Here, in the first state, the substrate stage 4 is arranged at the first rotation angle, which is a predetermined reference rotation angle (for example, 0° in the $\theta Z$ direction with respect to the X direction or Y direction), in a plane (in the X-Y plane) parallel to the holding surface of the substrate stage 4 for holding the substrate 3. In the first state, the substrate stage 4 is preferably arranged such that light from the laser interferometer 10 is perpendicularly applied to the mirror 8 on the substrate stage 4.

In step S48, a process (binocular alignment for the first substrate) is performed in which the plurality of alignment marks 19 provided on the first substrate 3 are detected by two position detection systems 42 (binocular) of the plurality of position detection systems 42 to obtain the detection values of the respective alignment marks 19. More specifically, as illustrated in FIG. 11, if the substrate 3 is placed while being rotated with respect to the substrate stage, 4, the two position detection systems 42a and 42c simultaneously detect the alignment marks 19a and 19b while rotating the substrate stage 4 in the $\theta Z$ direction. Here, the detection value of one alignment mark (for example, the alignment mark 19a) of the alignment marks 19a and 19b is referred to as a detection value 50. The rotation angle of the substrate stage 4 is referred to as $\theta 45$.

In this manner, step S48 corresponds to a second process of obtaining a second detection value by detecting the plurality of alignment marks 19 by two or more detection systems 42 of the plurality of position detection systems 42 in a second state in which the substrate stage 4 is arranged at a second rotation angle different from the first rotation angle. Here, in the second state, the substrate stage 4 is arranged at the second rotation angle in the plane (in the X-Y plane) parallel to the holding surface of the substrate stage 4 for holding the substrate 3. In the second state, the substrate stage 4 is arranged such that two or more position detection systems 42 of the plurality of position detection systems 42 can detect the plurality of alignment marks 19 provided on the substrate 3 (first object) held by the substrate stage 4. Further, in the second state, at least one of the rotation direction and rotation amount of the substrate stage 4 is different from that in the first state.

In steps S47 and S48, the substrate 3 is held (placed) in the same state with respect to the substrate stage 4. Therefore, the detection value of each alignment mark 19 is ideally the same in steps S47 and S48. However, in practice, since there is an influence of an error in driving correction of the substrate stage 4 in the $\theta Z$ direction, the detection value of each alignment mark changes between step S47 and S48. Here, the control unit 17 obtains, as a detection value $\Delta 51$, the difference between the detection value 49 obtained in step S47 and the detection value 50 obtained in step S48. In this manner, the control unit 17 functions as a processing unit that obtains the difference between the first detection value (detection value 49) and the second detection value (detection value 50).

In step S52, a process (binocular alignment for the second substrate) is performed in which the plurality of alignment marks 19 provided on the second substrate 3 are detected by two position detection systems 42 (binocular) of the plurality of position detection systems 42 to obtain the detection values of the respective alignment marks 19. More specifically, if the substrate 3 is placed while being rotated with respect to the substrate stage 4 as illustrated in FIG. 13, the two position detection systems 42a and 42c simultaneously detect the alignment marks 19a and 19b while rotating the substrate stage 4 in the θZ direction. Here, the detection value of one alignment mark (for example, the alignment mark 19a) of the alignment marks 19a and 19b is referred to as a detection value 53. The rotation angle of the substrate stage 4 is referred to as θ46.

Note that in steps S48 and S52, the substrate 3 is basically held (placed) in different states (rotations) with respect to the substrate stage 4. Therefore, the θZ-direction rotation of the substrate stage 4 necessary for simultaneous detection of the alignment marks 19a and 19b changes between steps S48 and S52. In other words, at least one of the rotation direction and rotation amount of the substrate stage 4 changes between steps S48 and S52. The rotation difference between the rotation angle θ45 of the substrate stage 4 in step S48 and the rotation angle θ46 of the substrate stage 4 in step S52 is referred to as a θZ difference 454.

In step S80, the detection value of each alignment mark 19 obtained in step S52 is corrected to obtain a correction value TV53. The detection value 53 of the alignment mark 19a obtained in step S52 includes an influence of an error in driving correction of the substrate stage 4 in the θZ direction with respect to the alignment mark 19a obtained in step S47. Therefore, it is necessary to obtain the correction value TV53 by removing the influence of the error in driving correction of the substrate stage 4 in the θZ direction from the detection value 53 of the alignment mark 19a obtained in step S52 (that is, by correcting the detection value 53). More specifically, the detection value 451 and the product of the θZ difference 454 and a θZ coefficient are subtracted from the detection value 53 ("detection value 53−detection value Δ51−θZ difference Δ54×θZ coefficient"), thereby obtaining the correction value TV53. Note that the θZ coefficient is a coefficient that represents the error amount generated in accordance with the rotation angle at which the substrate stage 4 is arranged, that is, the relationship between the rotation angle at which the substrate stage 4 is arranged and the error amount included in the detection value of the alignment mark 19.

In this manner, step S52 corresponds to a third process, for the second or subsequent substrate 3, of obtaining a third detection value by detecting the plurality of alignment marks 19 by two or more detection systems 42 of the plurality of position detection systems 42 in the third state in which the substrate stage 4 is arranged at a third rotation angle. The third rotation angle is different from the second rotation angle. The third state is a state in which the substrate stage 4 is arranged at the third rotation angle in the plane (in the X-Y plane) parallel to the holding surface of the substrate stage 4 for holding the substrate 3. Here, since the first process (step S47) and the second process (step S48) have been performed, the difference between the first detection value (detection value 49) and the second detection value (detection value 50) has been obtained. Accordingly, for the second or subsequent substrate 3 (second object) which is processed after the first substrate 3 (first object), it is unnecessary to perform the first process and the second process. In the third state, at least one of the rotation direction and rotation amount of the substrate stage 4 is different form that in the second state. Further, in the third state, the substrate stage 4 is arranged such that two or more position detection systems 42 of the plurality of position detection systems 42 can detect the plurality of alignment marks 19 provided on the second or subsequent substrate 3 (second object) held by the substrate stage 4.

Figure 15:
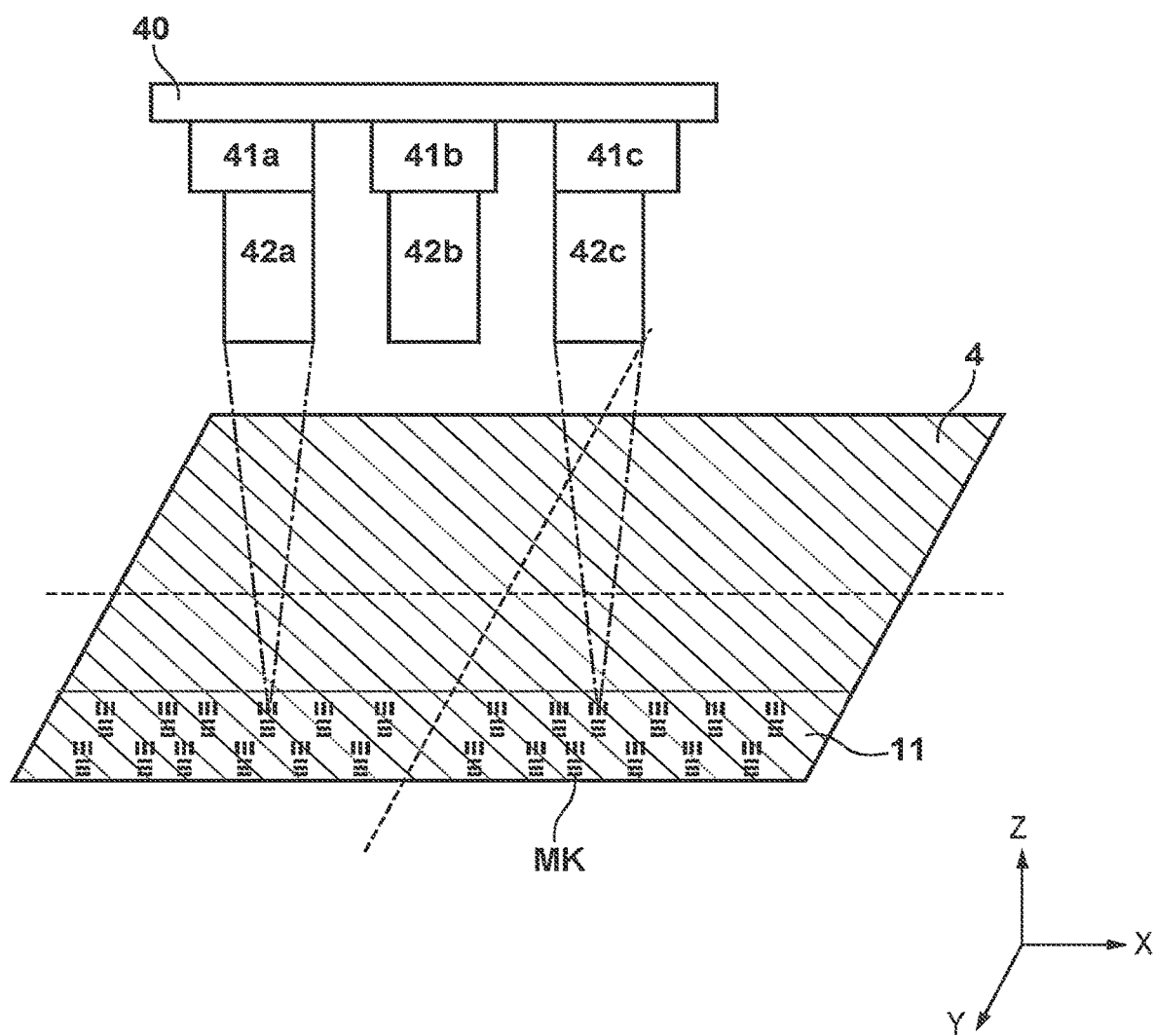
FIG. 15 is a view for explaining a $\theta Z$ coefficient in detail.
Figure 16:
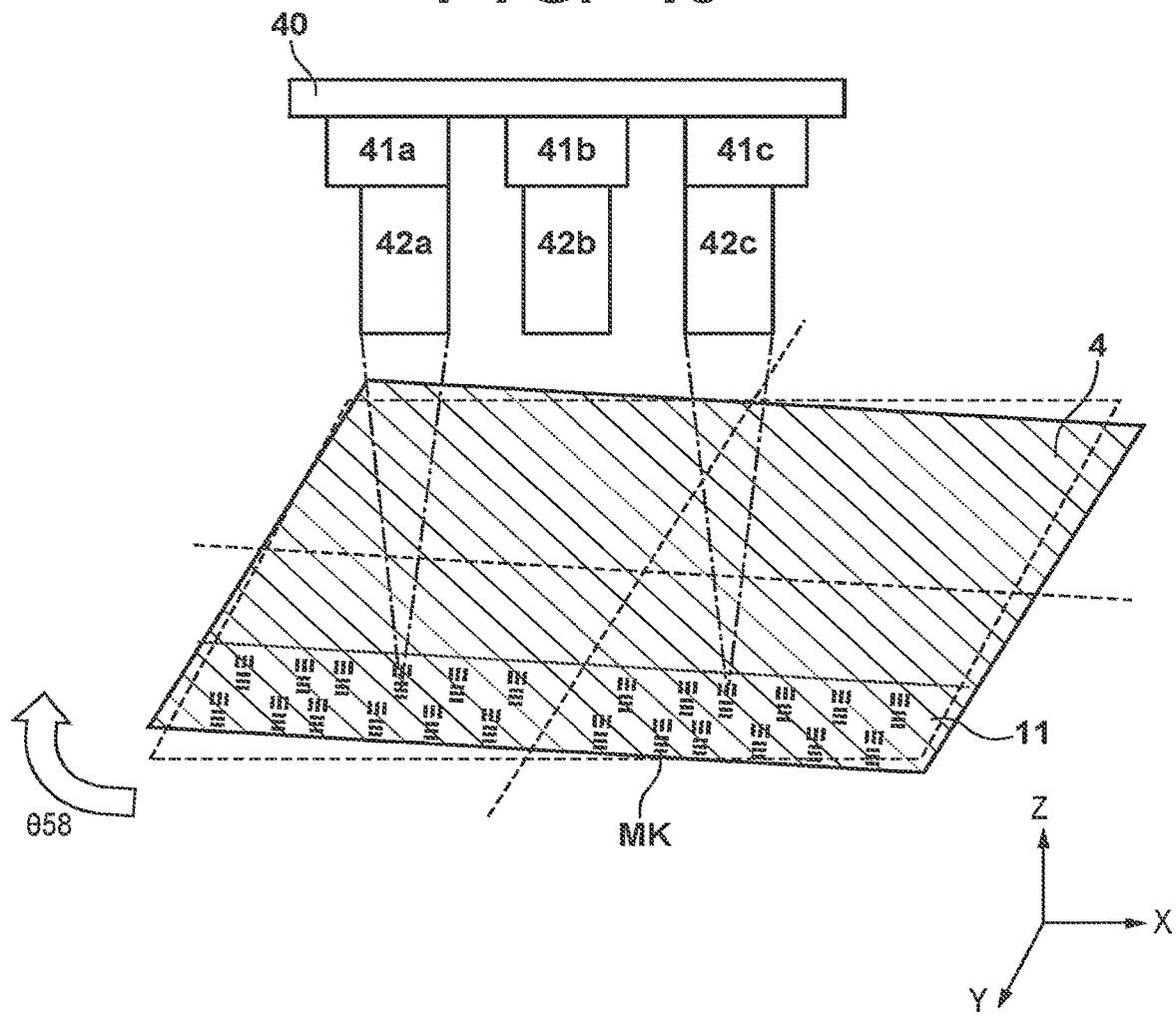
FIG. 16 is a view for explaining the $\theta Z$ coefficient in detail.

With reference to FIGS. 15 and 16, the θZ coefficient will be described in detail. First, as illustrated in FIG. 15, in a state in which the substrate stage 4 is arranged at the predetermined reference rotation angle in the θZ direction, the position detection systems 42a and 42c simultaneously detect reference marks MK of the substrate reference plate 11 provided on the substrate stage 4. Here, the detection value of one reference mark Mk is stored as a detection value 56 in, for example, a storage unit of the control unit 17 or the like. Then, as illustrated in FIG. 16, in a state in which the substrate stage 4 is arranged at a rotation angle θ58 in the θZ direction, which is different from the reference angle, the position detection systems 42a and 42c simultaneously detect the reference marks MK of the stage reference plate 11 provided on the substrate stage 4. Here, the detection value of the same reference mark Mk as in FIG. 15 is stored as a detection value 57 in, for example, the storage unit of the control unit 17 or the like.

The difference between the detection values generated by rotating the substrate stage 4 at the rotation angle θ58 in the θZ direction is expressed by detection value 57−detection value 56. Accordingly, the θZ coefficient that represents the error amount generated in accordance with the rotation state of the substrate stage 4 is obtained by (detection value 57−detection value 56)/θ58. In this manner, the θZ coefficient is obtained in advance based on the detection values obtained by detecting the reference marks MK provided on the substrate stage 4 by the plurality of position detection systems 42 while changing the rotation angle of the substrate stage 4.

In this embodiment, for the sake of descriptive convenience, an example is illustrated in FIGS. 15 and 16 in which the θZ coefficient is obtained by detecting the same reference mark MK. However, the present invention is not limited to this. For example, the θZ coefficient may be obtained by largely rotating the substrate stage 4 in the θZ direction and detecting different reference marks. The coordinates (position) of the reference mark provided on the stage reference plate 11 are known. Accordingly, when detecting different reference marks, the θZ coefficient can be obtained by subtracting the difference between the design values of the coordinates of the respective reference marks from the difference between the detection values, and dividing the subtraction result by the rotation angle of the substrate stage 4. When the substrate stage 4 is largely rotated and different reference marks are detected, the difference between the detection values increases with respect to the detection reproducibility, and a more accurate θZ coefficient can be obtained.

Further, in this embodiment, for the sake of descriptive convenience, the substrate stage 4 is arranged at different two rotation angles, and the θZ coefficient is linearly obtained from the difference between the detection values obtained at the respective rotation angles. However, the present invention is not limited to this. For example, the substrate stage 4 may be arranged at three or more rotation angles, and the θZ coefficient may be obtained, using an approximation formula, from the detection values (values thereof) each obtained in a state in which the substrate stage 4 is arranged at each rotation angle.

Since the θZ coefficient is obtained using the stage reference plate 11 (reference marks), the θZ coefficient need only be obtained once in a stage prior to alignment and exposure of the substrate 3. More specifically, if the θZ coefficient is obtained in advance in an adjustment stage of the apparatus, it is unnecessary to obtain the θZ coefficient again unless the adjustment state of the apparatus changes, and the θZ coefficient can be continuously used.

Further, in this embodiment, the θZ coefficient is obtained from the detection values obtained by detecting the reference marks MK provided on the stage reference plate 11, but the θZ coefficient may be obtained from the detection values obtained by detecting the alignment marks 19 provided on the substrate 3.

In this embodiment, simultaneous detection of the alignment marks 19 by two position detection systems 42 (binocular) has been described. However, in practice, as illustrated in FIGS. 5 to 9, the alignment marks 19 may be detected by one position detection system 42 (monocular) without rotating the substrate stage 4 in the θZ direction. At this time, the detection values of the alignment mark 19 are preferably equal to each other regardless of the binocular detection or monocular detection. If the detection value of the alignment mark 19 changes between binocular detection and monocular detection, detection value management is required in accordance with a combination of the position detection systems 42 used in detection of the alignment marks 19 even with the same shot layout. This leads to complex management. In this embodiment (FIG. 14), the detection values of the alignment mark 19 can be matched between binocular detection and monocular detection. Thus, the alignment mark 19 can be detected without an influence of the placement error of the substrate 3 with respect to the substrate stage 4. Therefore, according to this embodiment, the Abbe error is suppressed, and the alignment mark 19 can be detected with high accuracy regardless of the binocular detection or monocular detection.

Figure 17:
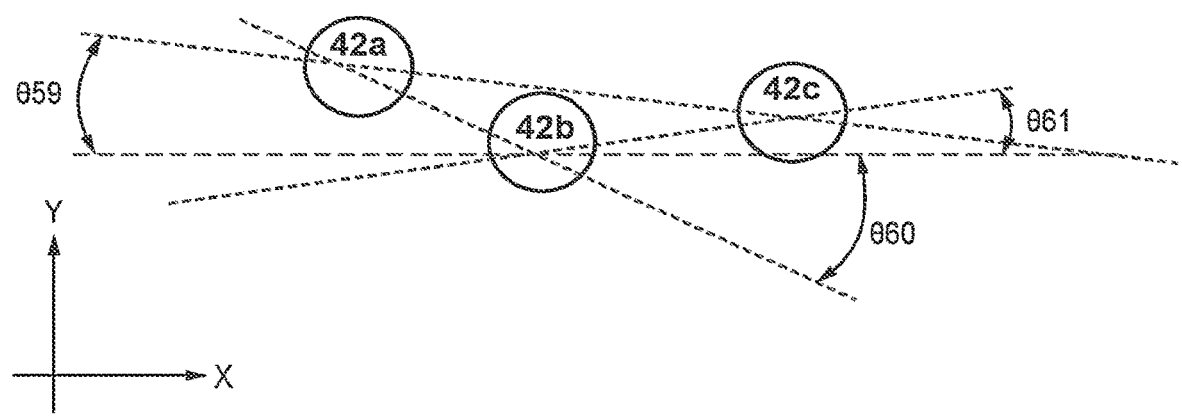
FIG. 17 is a view illustrating an example of attachment errors of position detection systems with respect to a base plate.

Upon attaching the position detection systems 42a, 42b, and 42c to the base plate 40, attachment errors generally occur. Of the attachment errors, the attachment error in the X direction can be reduced by driving the position detection systems 42a, 42b, and 42c in the X direction by the driving units 41a, 41b, and 41c, respectively, to adjust the relationship therebetween. On the other hand, for example, as illustrated in FIG. 17, an attachment error θ59 in the Y direction between the position detection system 42a and the position detection system 42c cannot be reduced by driving the position detection systems 42a and 42c by the driving units 41a and 41c. Therefore, ideally, it is preferable that there is no attachment error in the Y direction between the position detection system 42a and the position detection system 42c. However, in practice, depending on the shot layout, adjustment of the interval between the position detection system 42a and the position detection system 42c is necessary. Thus, the attachment error in the Y direction changes by driving the position detection systems 42a and 42c in the X direction.

In this embodiment, it is unnecessary to manage the attachment error (error amount) in the Y direction in accordance with the X-direction positions of the position detection systems 42a and 42c. More specifically, the attachment error θ59 in the Y direction between the position detection system 42a and the position detection system 42c can be handled by adding it to the error amount (θZ error) generated due to the placement error of the substrate 3 with respect to the substrate stage 4. For example, in FIG. 13, assuming that there is no attachment error in the Y direction between the position detection system 42a and the position detection system 42c, the substrate stage 4 is rotated in the θZ direction to reduce the influence of the placement error of the substrate 3 with respect to the substrate stage 4. Here, if there is the attachment error θ59 in the Y direction between the position detection system 42a and the position detection system 42c as illustrated in FIG. 17, the substrate stage 4 is rotated by a rotation angle θ46+θ59 in the θZ direction. In this manner, according to this embodiment, regardless of the attachment error in the Y direction in accordance with the X-direction positions of the position detection systems 42a and 42c, correction can be performed by rotating the substrate stage 4 in the θZ direction.

In this embodiment, a combination (binocular) of the position detection system 42a and the position detection system 42c is taken as an example and described. However, the present invention is applicable to a combination (binocular) of the position detection system 42a and the position detection system 42b. As illustrated in FIG. 17, the attachment error in the Y direction between the position detection system 42a and the position detection system 42b is referred to as an attachment error θ60. Assuming that there is no attachment error in the Y direction between the position detection system 42a and the position detection system 42b, the substrate stage 4 is rotated at the rotation angle θ46 in the θZ direction to reduce the influence of the placement error of the substrate 3 with respect to the substrate stage 4. In this example, the substrate stage 4 is rotated by a rotation angle θ46+θ60 in the θZ direction. In this manner, according to this embodiment, regardless of the attachment error in the Y direction in accordance with the X-direction positions of the position detection systems 42a and 42b, correction can be performed by rotating the substrate stage 4 in the θZ direction.

As illustrated in FIG. 17, the θZ error changes in accordance with the attachment errors of the position detection systems 42a, 42b, and 42c in the Y direction with respect to the base plate 40. Depending on the shot layout, the position detection systems 42a and 42b may simultaneously detect the alignment marks 19, or the position detection systems 42b and 42c may simultaneously detect the alignment marks 19.

Figure 18:
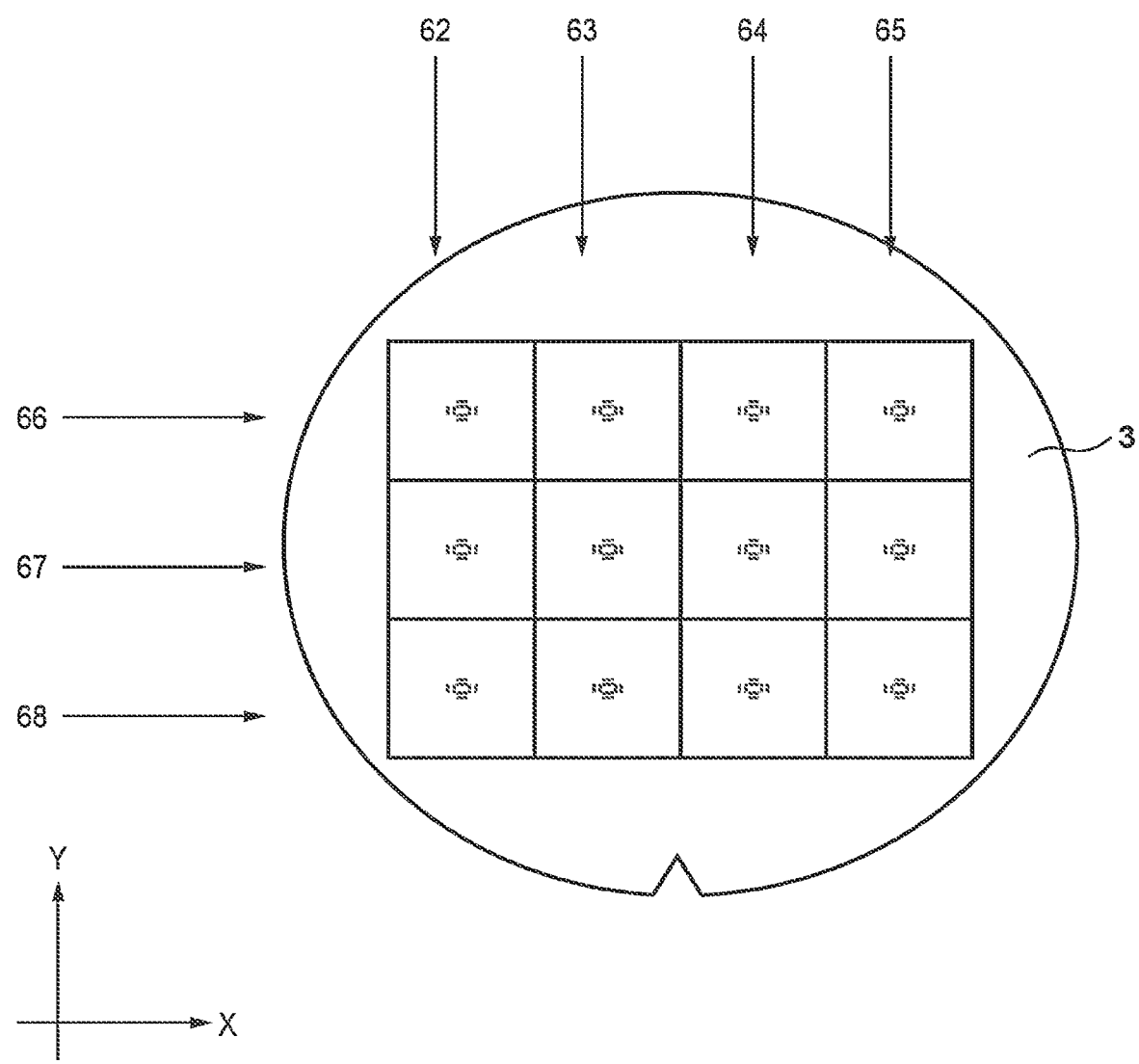
FIG. 18 is a view illustrating an example of alignment marks provided on a substrate.
Figure 19:
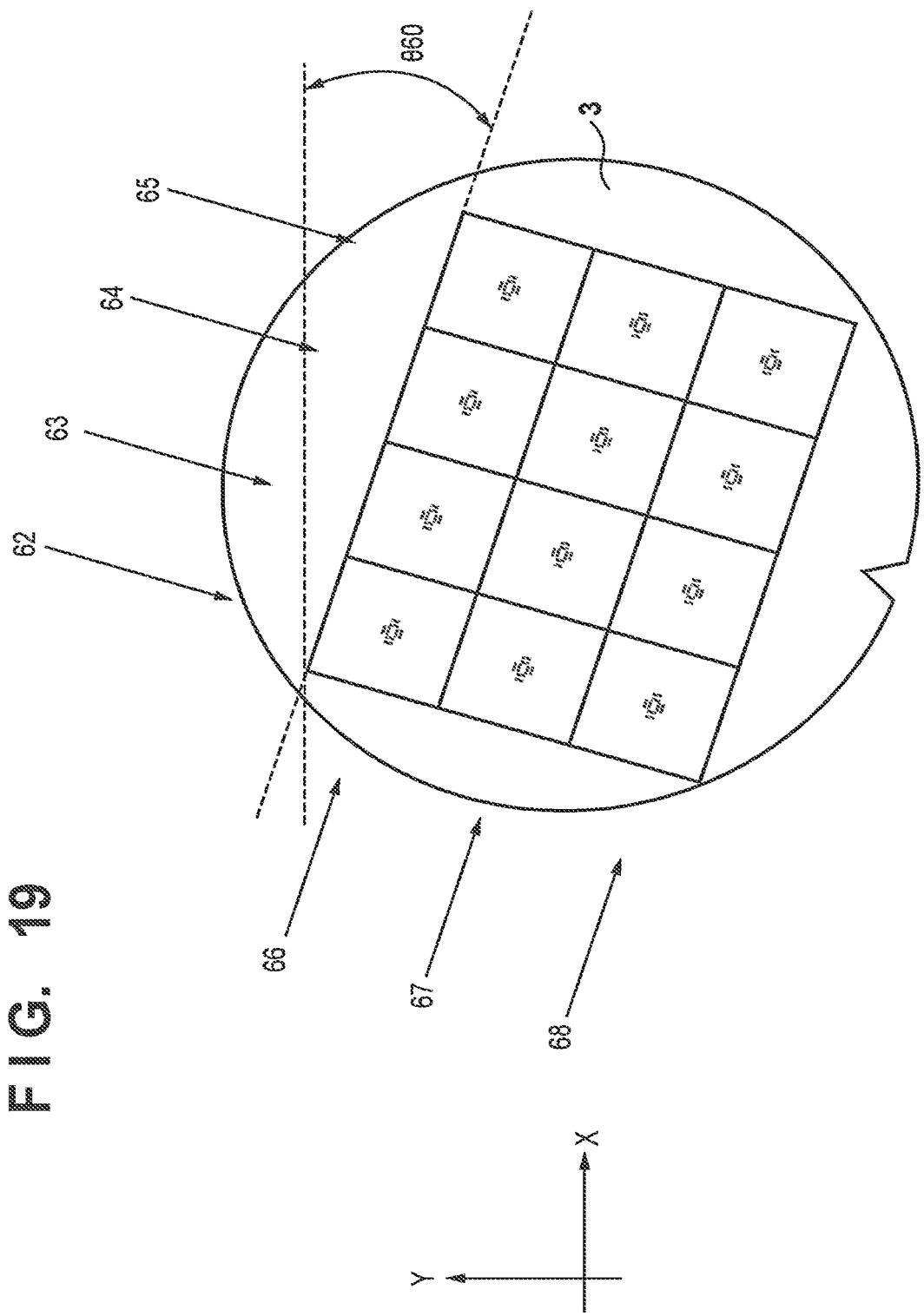
FIG. 19 is a view for explaining simultaneous detection of alignment marks by two position detection systems.
Figure 20:
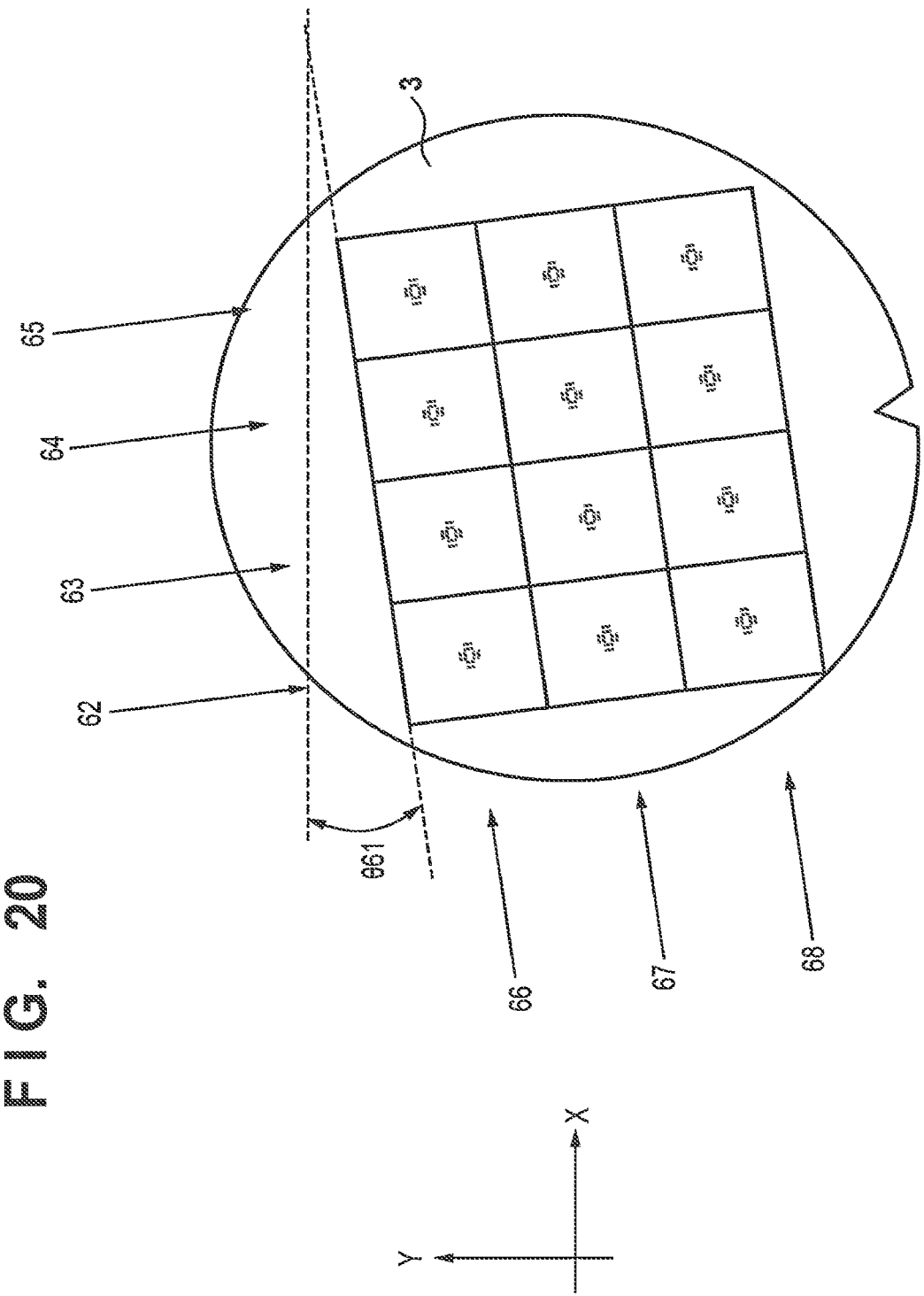
FIG. 20 is a view for explaining simultaneous detection of alignment marks by two position detection systems.

For example, FIG. 18 illustrates the simplified alignment marks 19 provided on the substrate 3. The alignment marks 19 are provided in four columns in the X direction and three rows in the Y direction, that is, 12 alignment marks 19 are provided in total. Assume a case in which the position detection systems 42a and 42b simultaneously detect the alignment marks 19 in a column L62 and a column L63, respectively, and the position detection systems 42b and 42c simultaneously detect the alignment marks 19 in a column L64 and a column L65, respectively. Here, as illustrated in FIG. 17, the attachment error in the Y direction between the position detection system 42a and the position detection system 42b is θ60, and the attachment error in the Y direction between the position detection system 42b and the position detection system 42c is θ61. In this case, when the position detection systems 42a and 42b simultaneously detect the alignment marks 19 in the columns L62 and L63, respectively, as illustrated in FIG. 19, the substrate stage 4 needs to be rotated in the θZ direction such that the substrate 3 is rotated at the rotation angle θ60. When the position detection systems 42b and 42c simultaneously detect the alignment marks 19 in the columns L64 and L65, respectively, as illustrated in FIG. 20, the substrate stage 4 needs to be rotated in the θZ direction such that the substrate 3 is rotated at the rotation angle θ61.

In this manner, when detecting the plurality of alignment marks 19 provided on the substrate 3, the substrate stage 4 is arranged at different rotation angles as illustrated in FIGS.

19 and 20. Accordingly, since the rotation angle (posture) at which the substrate stage 4 is arranged changes during detecting the plurality of alignment marks 19 provided on one substrate 3, different Abbe errors occur. Referring to FIG. 18, when detecting the alignment marks 19 in rows L66, L67, and L68, since they have different Y coordinates, Abbe errors rotating in the θZ direction occur depending on the Y-direction positions. Due to these factors, it is difficult to implement highly accurate detection of the alignment marks 19 by correcting the posture of the substrate stage 4 using an Abbe coefficient. On the other hand, according to this embodiment (FIG. 14), the difference between the detection values obtained in binocular alignment is managed based on monocular alignment. This enables highly accurate detection of the alignment marks 19 regardless of the attachment errors of the position detection systems 42.

As has been described above, in this embodiment, monocular alignment and binocular alignment are performed for the first substrate 3, the difference between the detection values is obtained, and the difference is used in correction of binocular alignment for the second or subsequent substrate 3. Since the placement error of the second or subsequent substrate 3 with respect to the substrate stage 4 is different from the placement error of the first substrate 3 with respect to the substrate stage 4, in this embodiment, the error caused by the rotation angle at which the substrate stage 4 is arranged is also corrected. With this, simultaneous detection of the alignment marks 19 on the substrate by the plurality of position detection systems 42 can be constantly performed with high accuracy regardless of the placement error (shift or θZ) of the substrate 3 with respect to the substrate stage 4. Hence, while using the plurality of position detection systems 42, it is possible to achieve an improvement in overlay accuracy and high throughput without being affected by the placement error of the substrate 3 with respect to the substrate stage 4.

The detection value Δ51, which is the difference between the detection value obtained by monocular alignment and the detection value obtained by binocular alignment for the first substrate 3, can be continuously used for the second and subsequent substrates 3, but may be updated at an appropriate timing.

For example, in the exposure apparatus 100, in general, 25 substrates are set as one lot, and apparatus calibration is performed at the first substrate in the lot (management is performed on a lot basis). Accordingly, the detection value Δ51 may be updated at the timing of changing the lot. In other words, the detection value Δ51 is preferably changed in accordance with the change of the lot which is the unit to process the substrates 3. Alternatively, the detection value Δ51 may be updated at the timing of changing the layout of the plurality of marks provided on the substrate 3, or may be updated when a predetermined time (certain time) has elapsed. In this embodiment, it has been described that the difference (detection value Δ51) between the detection values obtained by monocular alignment and binocular alignment for one alignment mark is obtained, but the present invention is not limited to this. The difference between the detection values obtained by monocular alignment and binocular alignment for the entire substrate 3, that is, each of the plurality of alignment marks may be obtained.

In this embodiment, a case has been described in which the position detection systems 42a and 42c (a combination thereof) simultaneously detect two alignment marks 19a and 19b provided on the substrate 3, but this does not limit the combination of the position detection systems. For example, the position detection systems 42a and 42b may simultaneously detect the alignment marks 19a and 19b, or the position detection system 42b and 42c may simultaneously detect the alignment marks 19a and 19b. Alternatively, the position detection systems 42a, 42b, and 42c (three views) may simultaneously detect three alignment marks 19 provided on the substrate 3.

It has been described that the driving units 41a, 41b, and 41c drive the position detection systems 42a, 42b, and 42c, respectively, only in the X direction, but they may drive the position detection systems 42a, 42b, and 42c, respectively, in all of the X direction, Y direction, and Z direction. In this case, a component that cannot be removed by driving the position detection systems 42a, 42b, and 42c by the driving units 41a, 41b, and 41c may be corrected by driving (rotating) the substrate stage 4.

In this embodiment, a case has been taken as an example and described in which the position detection systems 42a and 42c simultaneously detect the alignment marks 19a and 19b, respectively, by rotating the substrate stage 4 in the θZ direction as illustrated in FIGS. 11 and 13. However, each of the plurality of position detection systems 42 may individually detect the alignment marks 19 by setting each alignment mark 19 to the center of the field of view (detection region).

Second Embodiment

In this embodiment, an application to the attachment errors of position detection systems 42a, 42b, and 42c in the Z direction with respect to a base plate 40 will be described. The attachment errors of the position detection systems 42a, 42b, and 42c in the Z direction with respect to the base plate 40 cannot be reduced by driving the position detection systems 42a, 42b, and 42c by driving units 41a 41b, and 41c. In this case, a substrate stage 4 is rotated with, as the center, one axis (Y axis) in a plane (in the X-Y plane) parallel to the holding surface of the substrate stage 4 for holding the substrate 3. More specifically, it is necessary to correct the attachment errors of the position detection systems 42a, 42b, and 42c in the Z direction by rotating (tilting) the substrate stage 4 in the OY direction. Accordingly, as illustrated in FIG. 11, when simultaneously detecting alignment marks 19 by two position detection systems 42 by rotating the substrate stage 4 in the θZ direction, if there is an attachment error in the Z direction, the substrate stage 4 also needs to be rotated in the OY direction. This causes an Abbe error, so the conventional method cannot perform correction with the same accuracy as in driving correction of the substrate stage 4 in the X direction and the Y direction.

Figure 21:
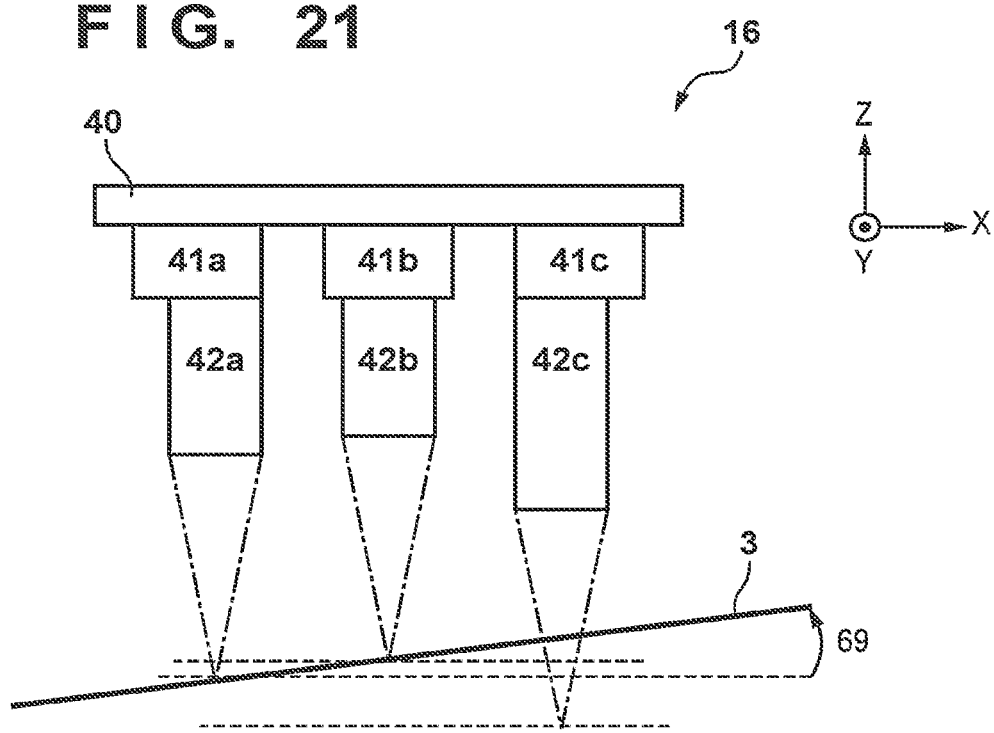
FIG. 21 is a view for explaining simultaneous detection of alignment marks by two position detection systems.
Figure 22:
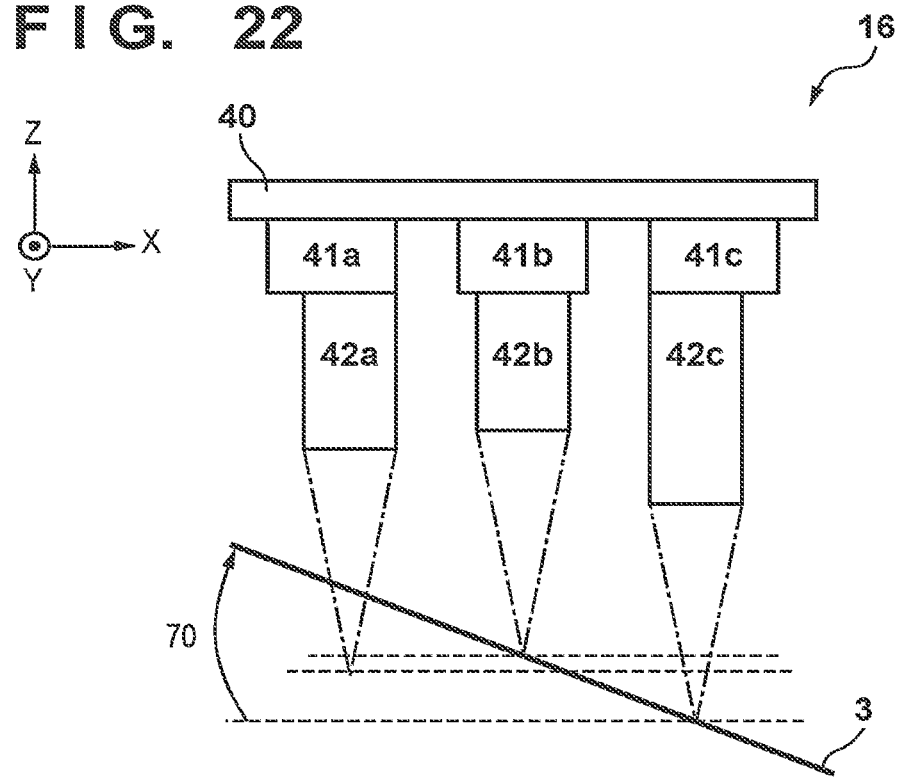
FIG. 22 is a view for explaining simultaneous detection of alignment marks by two position detection systems.

Assume a case in which the position detection systems 42a, 42b, and 42c are attached to the base plate 40 while being shifted in the Z direction so that they are defocused as illustrated in FIG. 21. In this case, in order to simultaneously detect the alignment marks 19 by the position detection systems 42a and 42b (two views), the substrate stage 4 needs to be rotated (tilted) in the direction (θY direction) indicated by an arrow 69. With this operation, the focus of each of the position detection systems 42a and 42b can be matched with the surface of the substrate 3, and the alignment marks 19 can be simultaneously detected. Note that when simultaneously detecting the alignment marks 19 by the position detection systems 42b and 42c (two views), the substrate stage 4 is rotated (tilted) in the direction (θY direction) indicated by an arrow 70 as illustrated in FIG. 22.

As has been described above, when simultaneously detecting the plurality of alignment marks 19 provided on the substrate 3 by using the position detection systems 42a, 42b, and 42c, the substrate stage 4 needs to be rotated not only in the θZ direction but also in the OY direction.

Third Embodiment

A method of manufacturing an article according to the embodiment of the present invention is suitable for manufacturing an article, for example, a liquid crystal display element, a semiconductor element, a flat panel display, or a MEMS. The manufacturing method includes a process of exposing, using the above-described exposure apparatus 100, a substrate to which a photoresist is applied, and a process of developing the exposed photoresist. In addition, an etching process, an ion implantation process, and the like are performed for the substrate using the pattern of the developed photoresist as a mask, thereby forming a circuit pattern on the substrate. By repeating the processes of exposure, development, etching, and the like, a circuit pattern formed by a plurality of layers is formed on the substrate. In the post-process, dicing (processing) is performed for the substrate on which the circuit pattern is formed, and chip mounting, bonding, and inspection processes are performed. The manufacturing method can also include other known processes (for example, oxidation, deposition, vapor deposition, doping, planarization, and resist removal). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-005821 filed on Jan. 18, 2022, which is hereby incorporated by reference herein in its entirety.

What is claimed is:

1. A detection apparatus for detecting a plurality of marks provided on an object, the detection apparatus comprising:
    a stage configured to be rotatable while holding the object;
    a plurality of detection systems arranged spaced apart from each other so as to detect, of the plurality of marks provided on the object held by the stage, marks different from each other; and
    a processing unit configured to perform a first process of obtaining a first detection value by detecting the plurality of marks by one or more detection systems of the plurality of detection systems in a first state in which the stage is arranged at a first rotation angle, and a second process of obtaining a second detection value by detecting the plurality of marks by two or more detection systems of the plurality of detection systems in a second state in which the stage is arranged at a second rotation angle different from the first rotation angle, and obtain a difference between the first detection value and the second detection value for each of the plurality of marks,
    wherein the second state is a state in which the stage is rotated with, as a center, one axis in a plane parallel to a holding surface of the stage for holding the object.

2. The apparatus according to claim 1, wherein:
    for a first object, the processing unit obtains the difference by performing the first process and the second process, and
    for a second object processed after the first object, the processing unit performs a third process of obtaining a third detection value by detecting a plurality of marks provided on the second object by two or more detection systems of the plurality of detection systems in a third state in which the stage is arranged at a third rotation angle different from the second rotation angle.

3. The apparatus according to claim 2, wherein the second state and the third state are different in at least one of a rotation direction or a rotation amount of the stage.

4. The apparatus according to claim 3, wherein the processing unit obtains a correction value by correcting the third detection value using the difference, a rotation difference between the second rotation angle and the third rotation angle, and a coefficient representing a relationship between a rotation angle of the stage and an error amount included in the detection value of the mark.

5. The apparatus according to claim 4, wherein the processing unit obtains the correction value by subtracting the difference and a product of the rotation difference and the coefficient from the third detection value.

6. The apparatus according to claim 4, wherein the processing unit obtains the coefficient in advance based on detection values obtained by detecting a reference mark provided on the stage by the plurality of detection systems while changing the rotation angle of the stage.

7. The apparatus according to claim 1, wherein the processing unit updates the difference by performing the first process and the second process in accordance with a change of a lot which is a unit to process the object.

8. The apparatus according to claim 1, wherein the processing unit updates the difference by performing the first process and the second process in accordance with a change of a layout of the plurality of marks provided on the object.

9. The apparatus according to claim 1, wherein the processing unit updates the difference by performing the first process and the second process in accordance with an elapse of a predetermined time.

10. A detection method of detecting a plurality of marks by using a detection unit that includes a stage configured to be rotatable while holding an object, and a plurality of detection systems arranged spaced apart from each other so as to detect, of the plurality of marks provided on the object held by the stage, marks different from each other, the method comprising:
    obtaining a first detection value by detecting the plurality of marks by one or more detection systems of the plurality of detection systems in a first state in which the stage is arranged at a first rotation angle;
    obtaining a second detection value by detecting the plurality of marks by two or more detection systems of the plurality of detection systems in a second state in which the stage is arranged at a second rotation angle different from the first rotation angle; and
    obtaining a difference between the first detection value and the second detection value,
    wherein the second state is a state in which the stage is rotated with, as a center, one axis in a plane parallel to a holding surface of the stage for holding the object.

11. An exposure apparatus for exposing a substrate, the exposure apparatus comprising:
    a detection apparatus configured to detect a plurality of marks provided on the substrate serving as an object, wherein the detection apparatus includes:
        a stage configured to be rotatable while holding the substrate;

a plurality of detection systems arranged spaced apart from each other so as to detect, of the plurality of marks provided on the substrate held by the stage, marks different from each other; and a processing unit configured to perform a first process of obtaining a first detection value by detecting the plurality of marks by one or more detection systems of the plurality of detection systems in a first state in which the stage is arranged at a first rotation angle, and a second process of obtaining a second detection value by detecting the plurality of marks by two or more detection systems of the plurality of detection systems in a second state in which the stage is arranged at a second rotation angle different from the first rotation angle, and obtain a difference between the first detection value and the second detection value for each of the plurality of marks, wherein the second state is a state in which the stage is rotated with, as a center, one axis in a plane parallel to a holding surface of the stage for holding the object.

12. An article manufacturing method comprising:

exposing a substrate using an exposure apparatus defined in claim 11;

developing the exposed substrate; and manufacturing an article from the developed substrate.

* * * * *